United States Patent [19]

Phillips

[11] Patent Number: 4,585,337
[45] Date of Patent: Apr. 29, 1986

[54] STEP-AND-REPEAT ALIGNMENT AND EXPOSURE SYSTEM

[76] Inventor: Edward H. Phillips, P.O. Box 1042, Middletown, Calif. 95461

[21] Appl. No.: 692,011

[22] Filed: Jan. 14, 1985

[51] Int. Cl.$^4$ .................. G03B 13/28; G03B 27/42; G01B 11/26; G01C 1/00
[52] U.S. Cl. ........................... 355/45; 355/53; 355/72; 356/152
[58] Field of Search .............. 355/43, 45, 53, 72; 269/21, 55, 903; 356/152; 29/760

[56] References Cited

U.S. PATENT DOCUMENTS

| | | | |
|---|---|---|---|
| 3,917,399 | 11/1975 | Buzawa et al. | 355/71 X |
| 4,383,757 | 5/1983 | Phillips | 355/53 |
| 4,391,494 | 7/1983 | Hershel | 355/43 X |
| 4,452,526 | 6/1984 | Johannsmeier et al. | 355/43 |
| 4,473,293 | 9/1984 | Phillips | 355/67 X |

Primary Examiner—Richard A. Wintercorn
Attorney, Agent, or Firm—Limbach, Limbach & Sutton

[57] ABSTRACT

An improved step and repeat alignment and exposure system for printing an image of a reticle onto a semiconductive wafer. A unit magnification catadioptric lens projects the reticle image onto the semiconductive wafer, and includes prisms to separate the image plane of the lens from the object plane. The semiconductive wafer is supported on stage means, which stage means provide motion in the X,Y directions. Viewing port means supplement the unit magnification catadioptric lens to provide a direct view of a portion of the semiconductive wafer which portion has been illuminated by the projected rectile image. A beam splitter is formed on a face of one of the prisms of the unit magnification catadioptric lens and is supplemented by an additional prism which provides optical path compatibility. A novel microscope structure is employed with large aperture focusing lenses to permit the infinity corrected objectives to translate about the field of view of the viewing port means without the requirement that any utilization device also translate in unison. Means are also provided for calibrating the position of the stage with respect to the reticle. Included are stage reference means which image a stage reference mark into the image plane of the unit magnification catadioptric lens when said stage reference means are illuminated by the projected reticle image. Means are provided for determining offset values between the projected reticle image and the stage reference mark and for utilizing said offsets in controlling the position of the stage. Further, means are provided for focusing and leveling the surface of the semiconductive wafer, wherein said means maintain, in a servo-controlled manner, said surface in a known position with respect to the stage. A six-degree of freedom support system is controlled by said focusing and leveling means to provide vertical position, pitch and roll movement of the semiconductive wafer.

47 Claims, 36 Drawing Figures

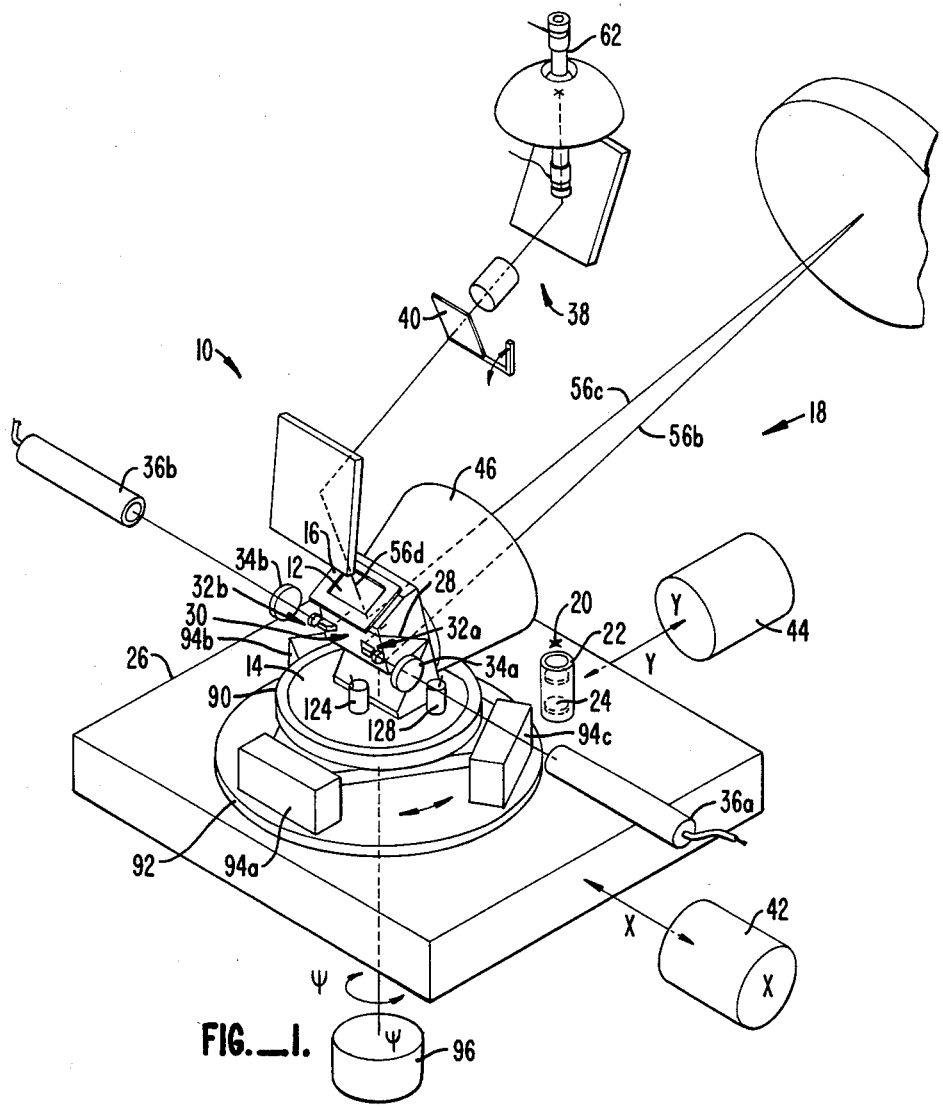
FIG._1.
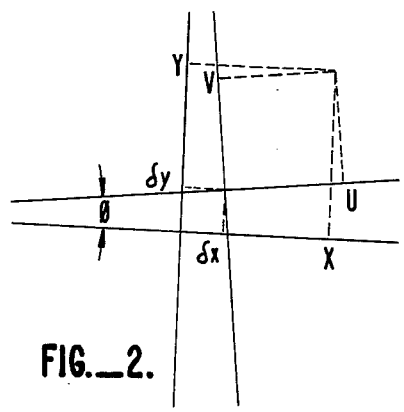
FIG._2.

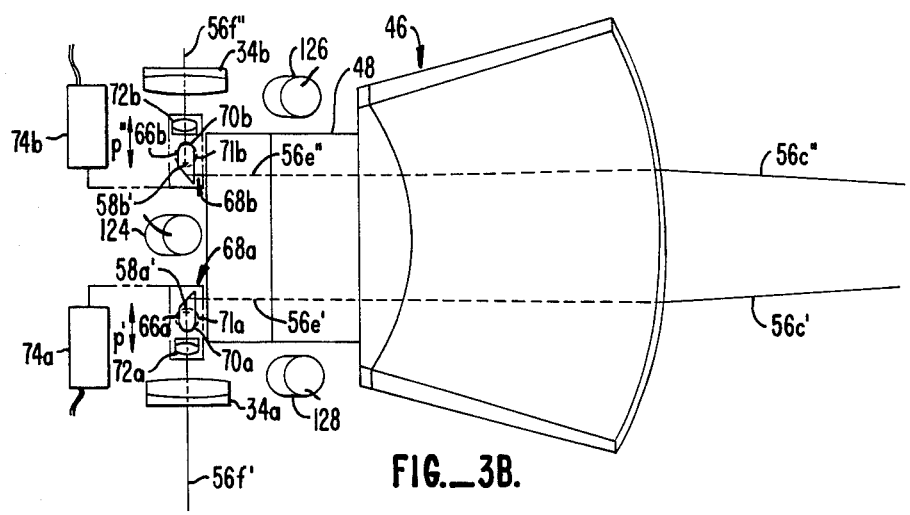
FIG._3B.
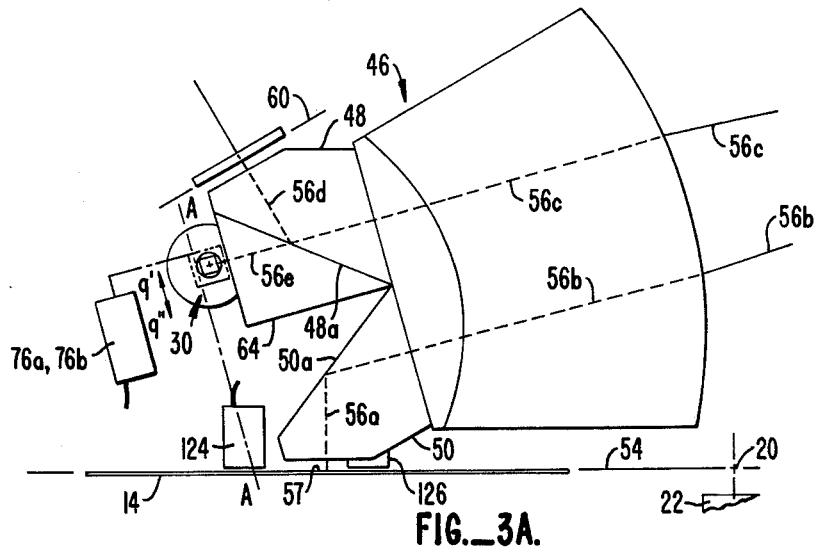
FIG._3A.
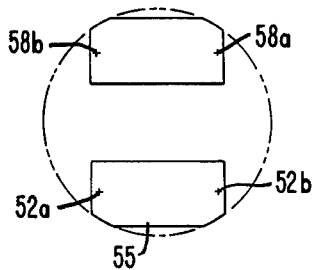
FIG._4.

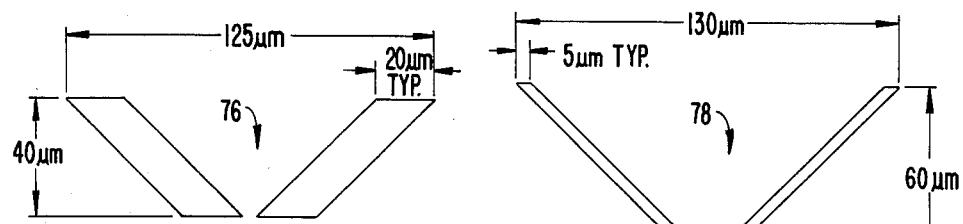
FIG._5A.  FIG._5B.
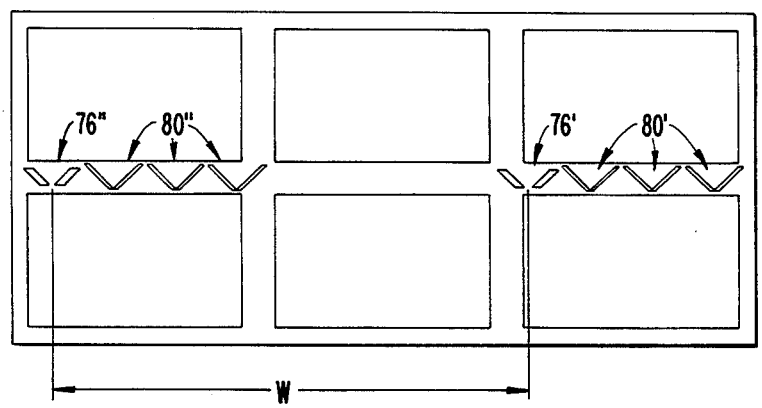
FIG._6.
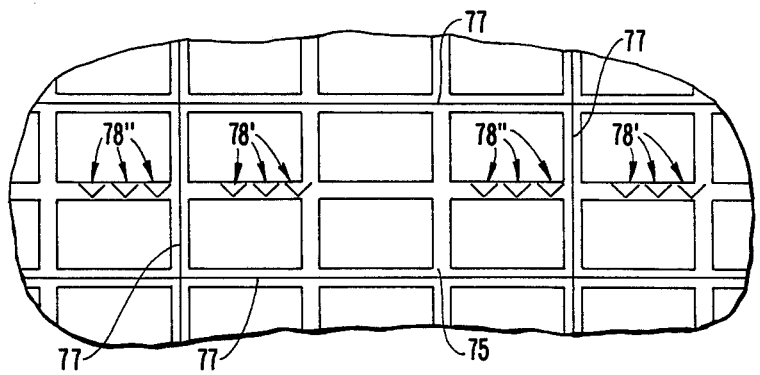
FIG._7.

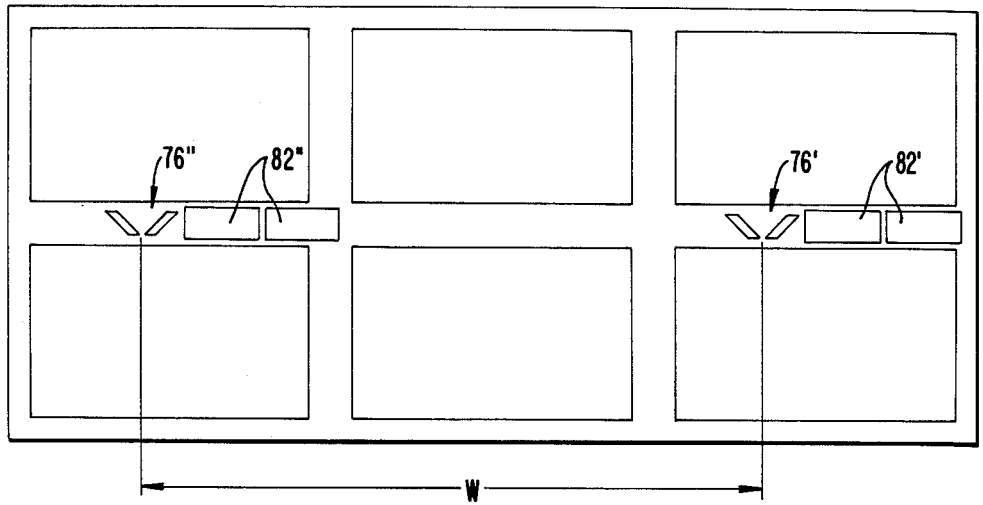
FIG._8B.
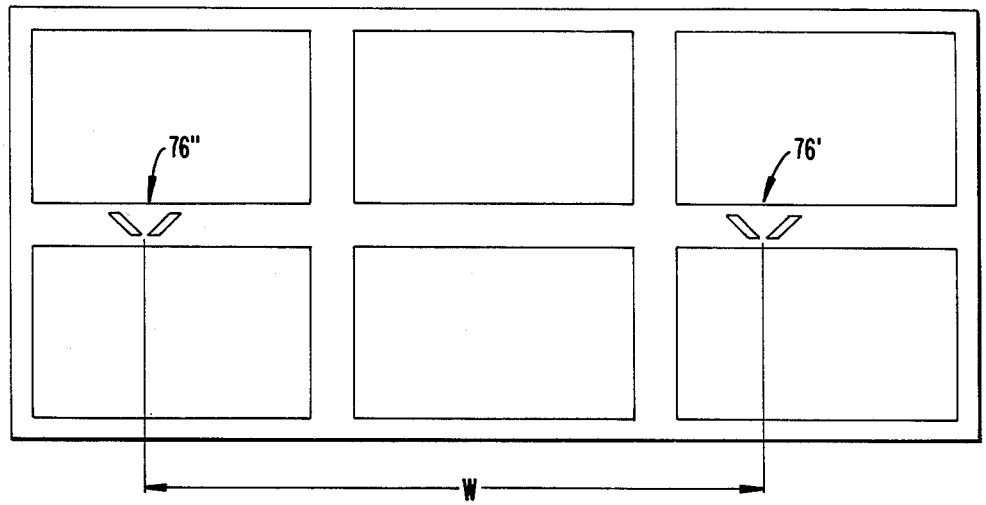
FIG._8A.

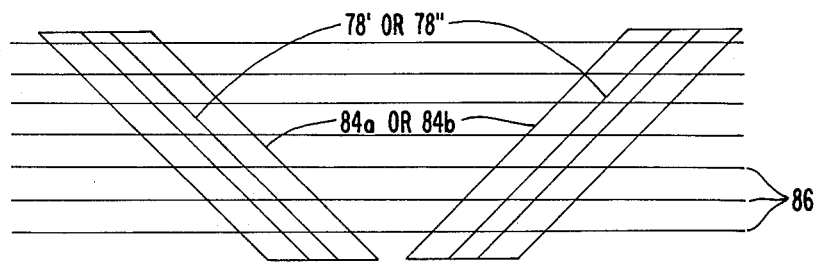
FIG._9.
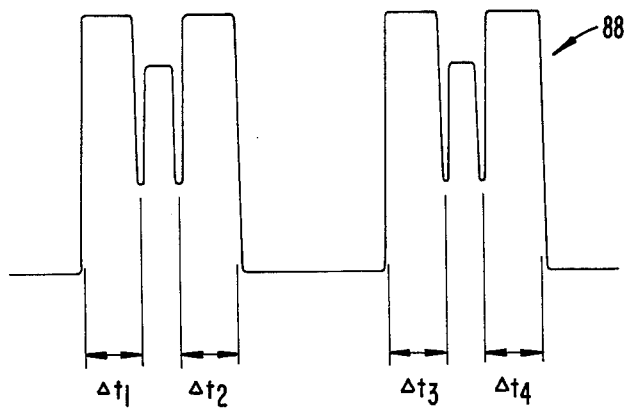
FIG._10.
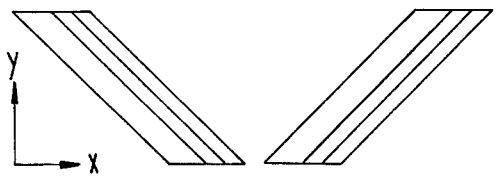
FIG._11A.
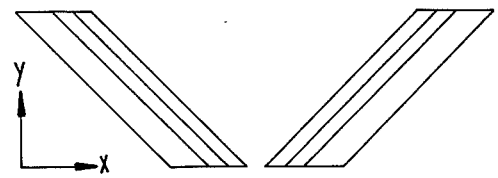
FIG._11B.

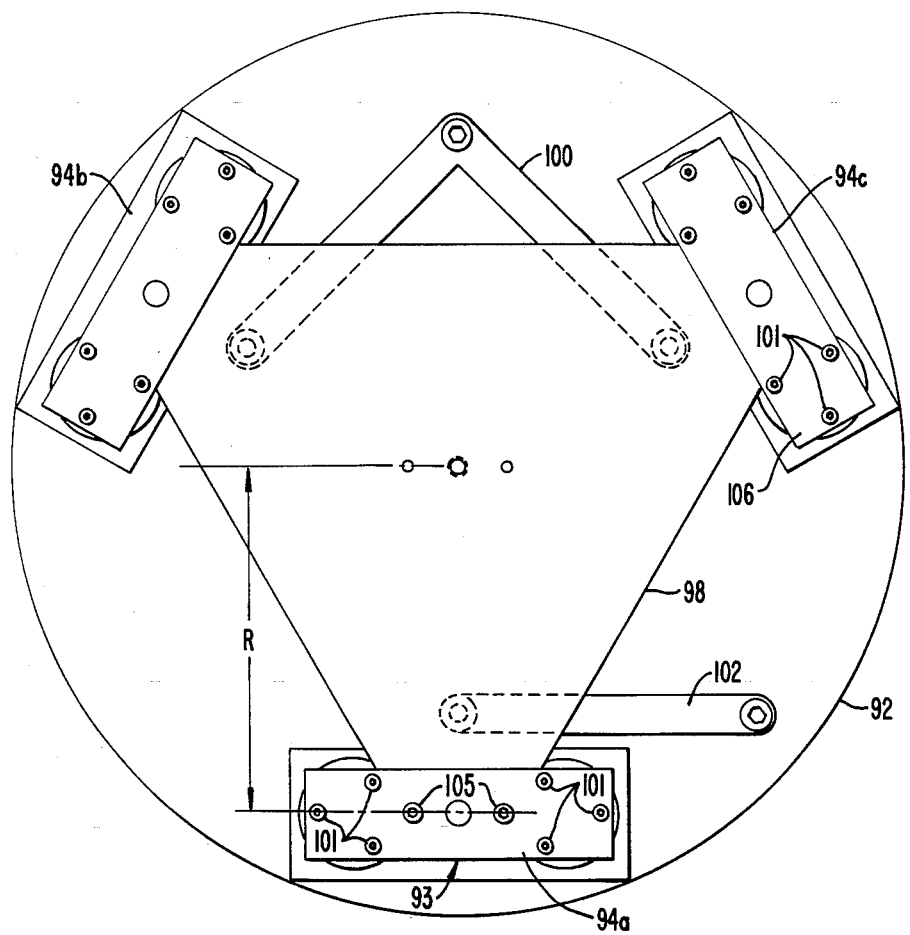
FIG._12.
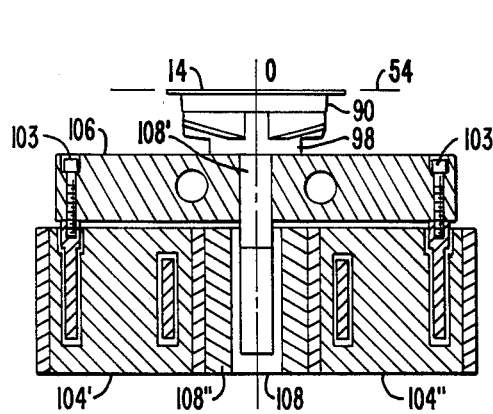
FIG._13.
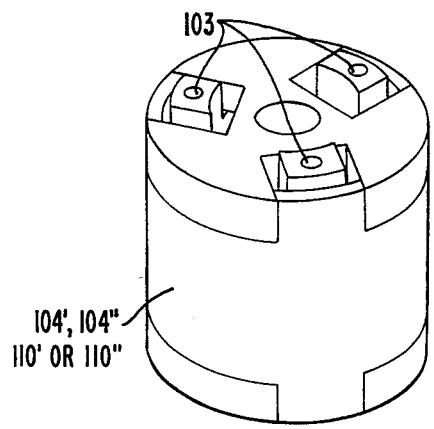
FIG._14.

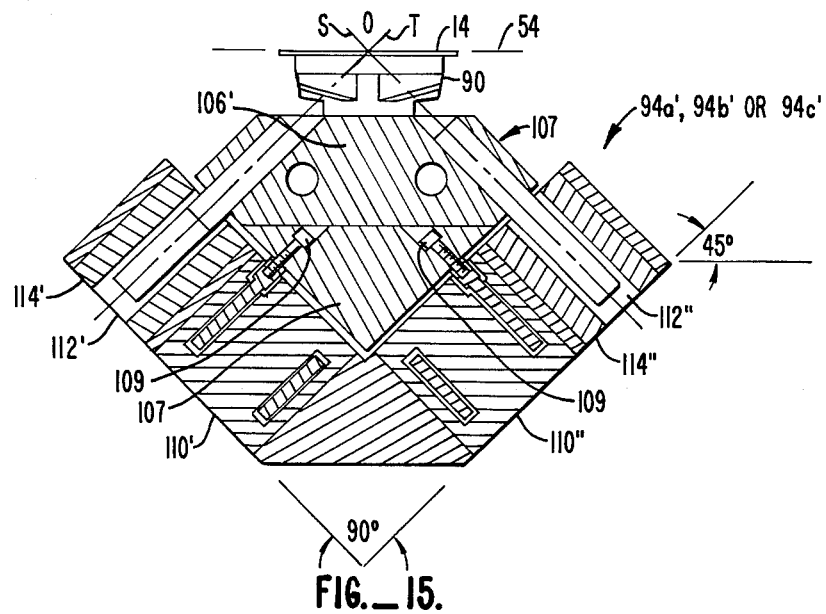
FIG._15.
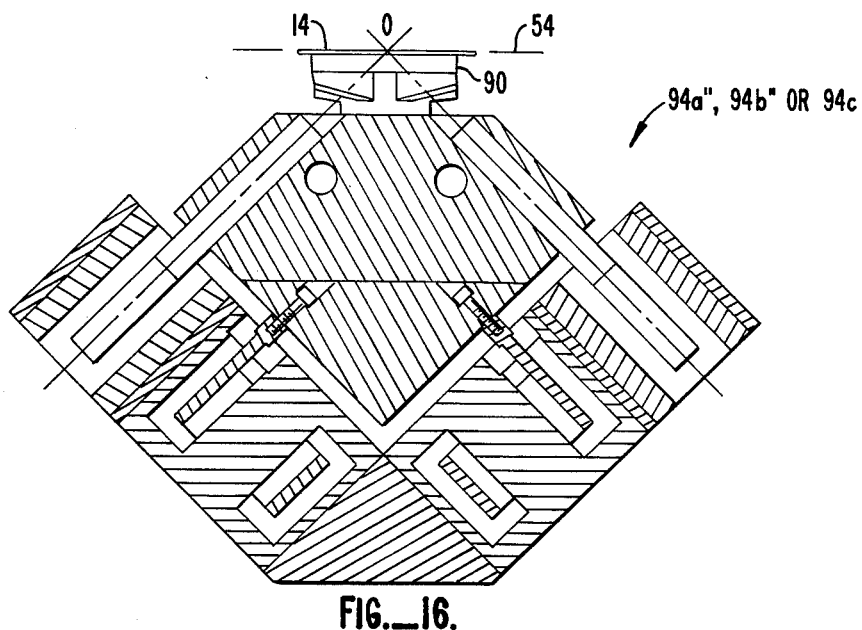
FIG._16.
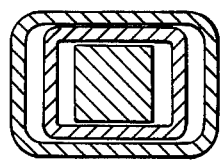
FIG._17.

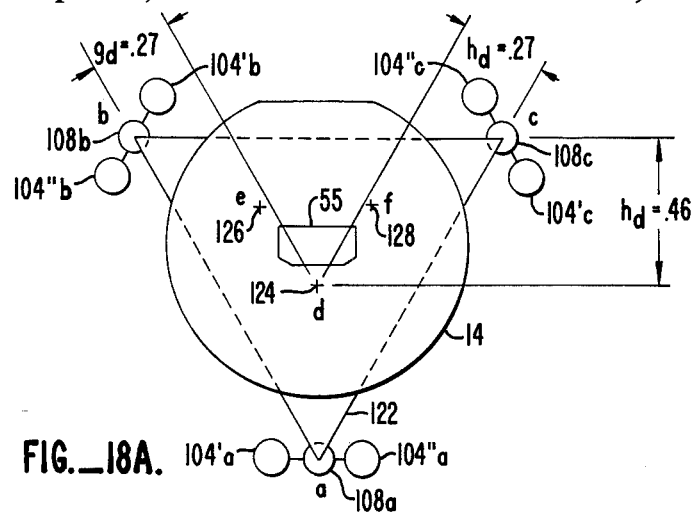
FIG._18A.
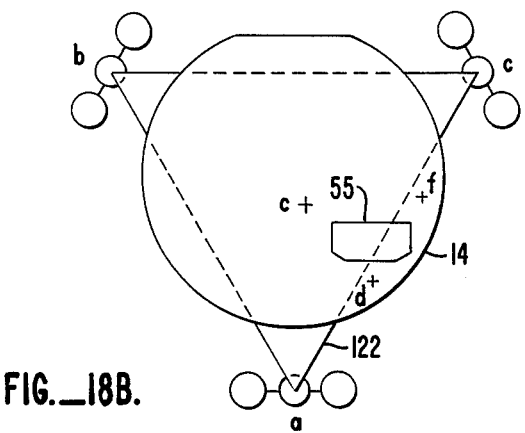
FIG._18B.
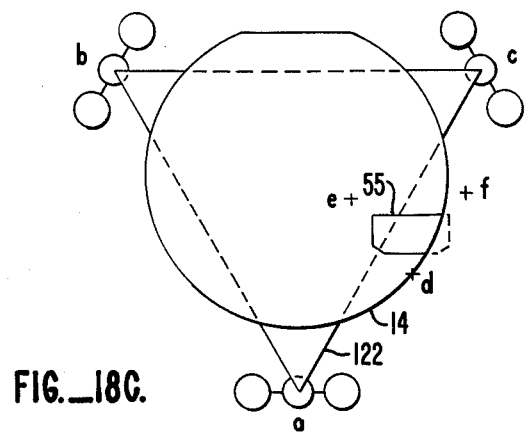
FIG._18C.

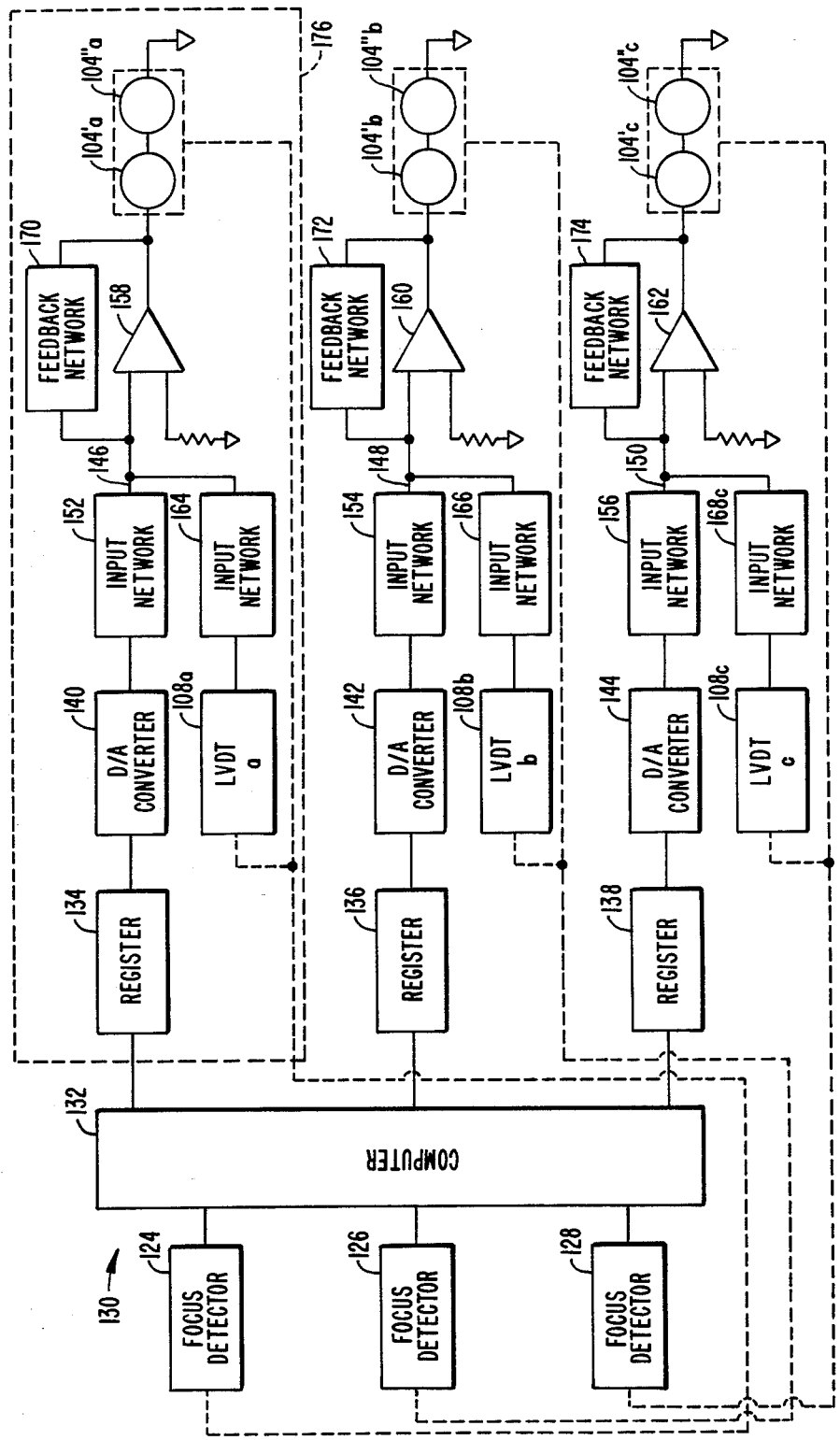
FIG.—19.

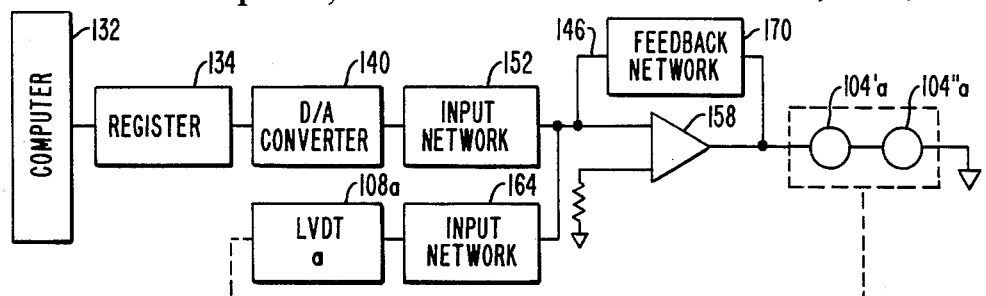
FIG._20A.
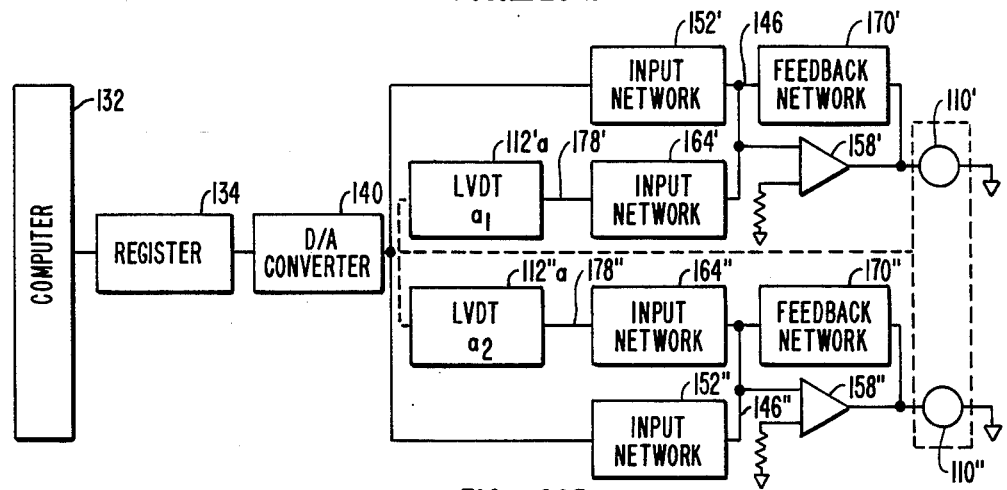
FIG._20B.
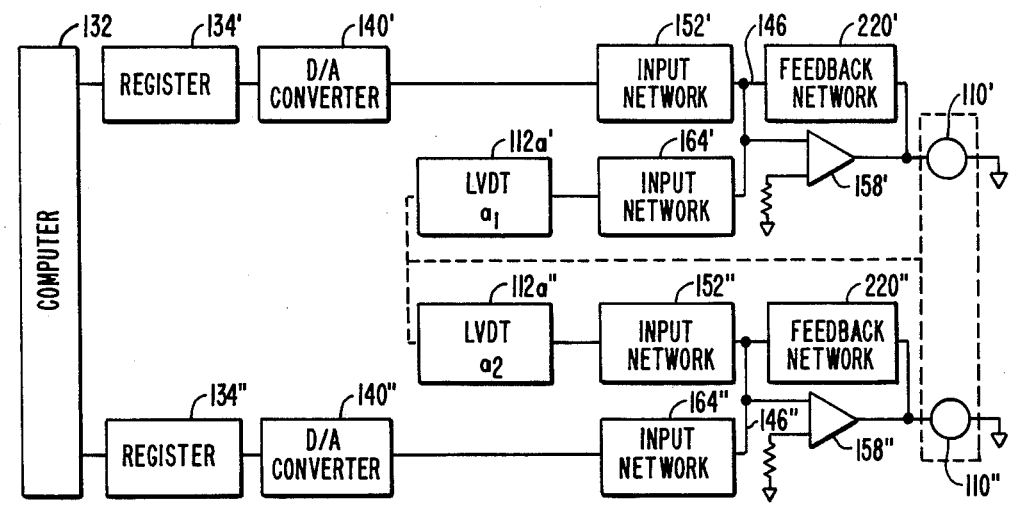
FIG._20C.

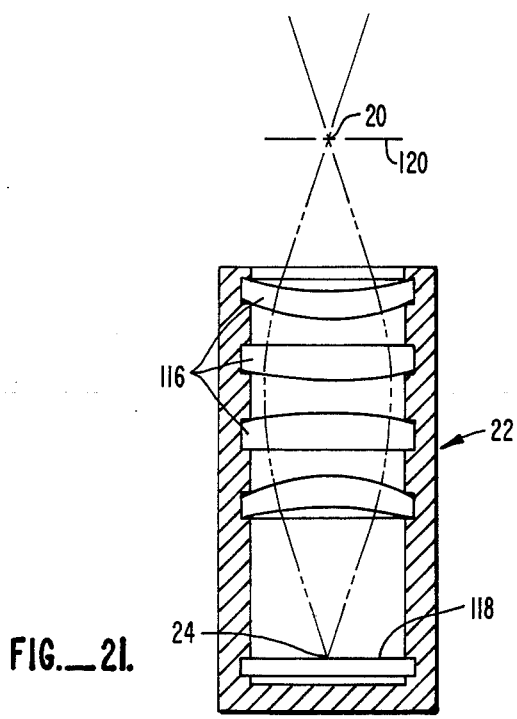
FIG.__21.
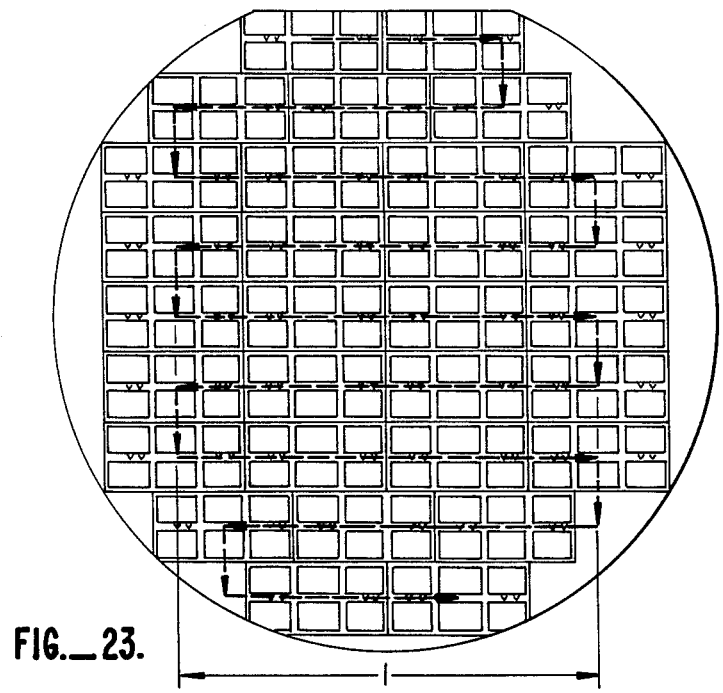
FIG.__23.

**LOAD RETICLE
AND
CALIBRATE STEP-AND-REPEAT ALIGNMENT SYSTEM**

LOAD RETICLE
↓
ALIGN LEFT ILLUMINATED AREA
↓
ALIGN RIGHT ILLUMINATED AREA
↓
CALCULATE OFFSET VALUES ($\delta x, \delta y$ AND $\phi$)

FIRST LEVEL WAFER PROCESSING

LOAD WAFER
↓
ROTATE CHUCK BY $\psi = \phi$
↓
EXPOSE WAFER REGION BY REGION ALONG U AND V AXES
↓
UNLOAD EXPOSED WAFER

HIGHER LEVEL BLIND WAFER PROCESSING

LOAD WAFER
↓
ROTATE CHUCK BY $\psi = \phi$
↓
MOVE TO NOMINAL ADDRESS FOR LEFT REGION
↓
ALIGN REGION AT LEFT
↓
MOVE TO NOMINAL ADDRESS FOR RIGHT REGION
↓
ALIGN REGION AT RIGHT
↓
CALCULATE BEST AVERAGE ALIGNMENT VALUES ($\delta u, \delta v$ AND $\delta \psi$)
↓
EXPOSE WAFER REGION BY REGION ALONG U AND V AXES
CORRECTED BY $\delta u, \delta v,$ AND $\delta \psi$.
↓
UNLOAD EXPOSED WAFER

HIGHER LEVEL ALIGNED WAFER PROCESSING

LOAD WAFER
↓
ROTATE CHUCK BY $\psi = \phi$
↓
MOVE TO NOMINAL ADDRESS FOR FIRST REGION
↓
ALIGN FIRST REGION
↓
EXPOSE FIRST REGION
↓
MOVE TO NOMINAL ADDRESS OF NEXT REGION
CORRECTED BY $\delta u$, $\delta v$ AND $\delta \psi$
↓
ALIGN
↓
EXPOSE
↓
ALL EXPOSED? — NO (loop back)
↓ YES
UNLOAD EXPOSED WAFER

COMPLETE PROCESSING OF ALL WAFERS IN LOT
↓
UNLOAD RETICLE

LOAD WAFER AND FOCUS AND LEVEL A REGION

LOWER CHUCK TO BOTTOM OF TRAVEL RANGE
↓
LOAD WAFER
↓
ROTATE CHUCK BY $\psi = \phi$
↓
MOVE STAGE TO THE U, V ADDRESS OF A REGION
↓
MEASURE $z_d$, $z_e$ AND $z_f$
↓
CALCULATE $z_a$, $z_b$ AND $z_c$
↓
STORE CALCULATED VALUES IN REGISTERS
↓
DRIVE SUPPORT ASSEMBLIES TO POSITION WHERE LVDT OUTPUTS
MATCH THE CALCULATED VALUES
↓
UTILIZE CALCULATED VALUES TO CALCULATE $\delta x$, $\delta v$ AND $\delta \psi$ OFFSETS
NECESSARY TO COMPENSATE FOR LINK FORESHORTENING
↓
MOVE STAGE AND $\psi$ PLATFORM BY THE CALCULATED OFFSETS
↓
VERIFY THAT THE WAFER IS FOCUSED AND LEVELED

FIG._24A.

LEVEL A REGION WITH ONE OR TWO FOCUS DETECTORS OFF WAFER

DETERMINE THAT ONE OR TWO FOCUS DETECTORS WILL BE OFF WAFER
↓
DETERMINE WHICH FOCUS DETECTORS WILL BE OFF WAFER
↓
DEACTIVATE THOSE FOCUS DETECTORS
↓
MOVE STAGE TO THE U,V ADDRESS OF NEW REGION
↓
MEASURE $z_d$, $z_e$ AND/OR $z_f$ WITH ACTIVE FOCUS DETECTORS
↓
CALCULATE $\Delta z_a = \Delta z_b = \Delta z_c$
↓
STORE NEW $z_a$, $z_b$ AND $z_c$ VALUES IN REGISTERS
↓
DRIVE SUPPORT ASSEMBLIES TO POSITION WHERE LVDT OUTPUTS MATCH THE NEW VALUES
↓
UTILIZE NEW VALUES TO CALCULATE $\delta x$, $\delta v$ AND $\delta \psi$ OFFSETS NECESSARY TO COMPENSATE FOR LINK FORESHORTENING
↓
MOVE STAGE AND PLATFORM BY THE CALCULATED OFFSETS
↓
VERIFY THAT THE WAFER IS FOCUSED

FIG.—24B.

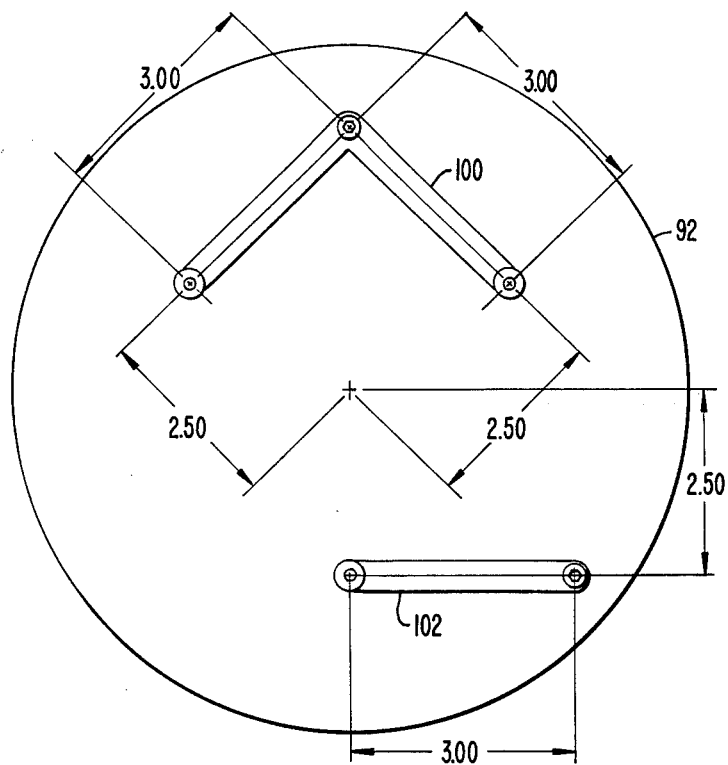
FIG._25.
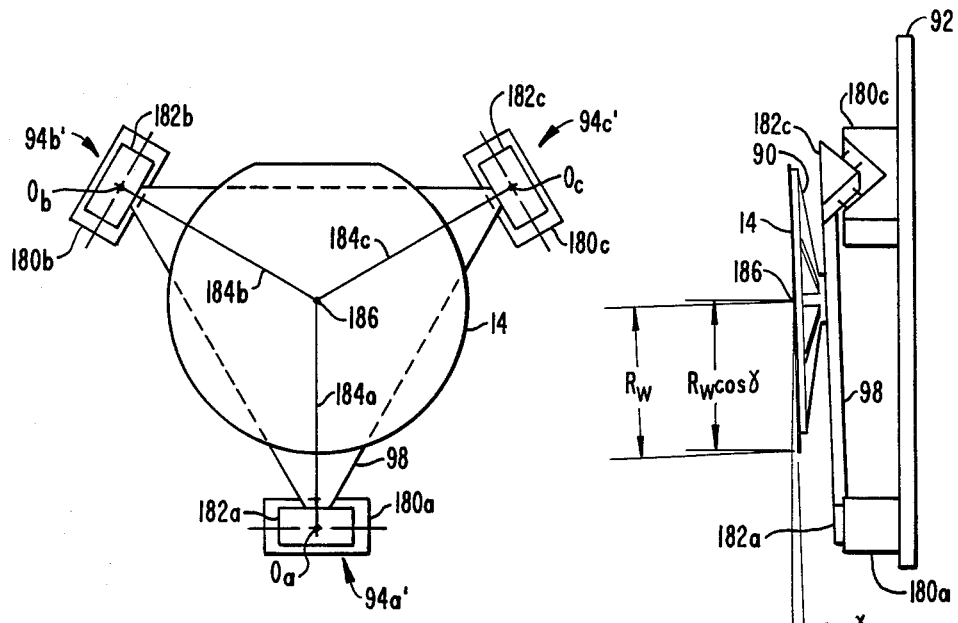
FIG._26A.
FIG._26B.

STEP-AND-REPEAT ALIGNMENT AND EXPOSURE SYSTEM

TECHNICAL FIELD

This invention relates generally to step-and-repeat alignment and exposure systems utilizing a projection lens of the unit magnification catadioptric type, such as the Dyson-Wynne system as shown, for example, in U.S. Pat. No. 4,391,494 entitled APPARATUS FOR PROJECTING A SERIES OF IMAGES ONTO DIES OF A SEMICONDUCTOR WAFER and issued July 5, 1983 to Ronald S. Hershel, or the aberration balanced design shown in U.S. Pat. No. 3,917,399 entitled CATADIOPTRIC PROJECTION PRINTER and issued Nov. 4, 1975 to M. John Buzawa and Charles M. Munnelyn for the photometric printing of an image of a first object, such as a reticle, upon a second object, such as a semiconductive wafer, in a step-and-repeat manner; and, more specifically, to apparatus for use in such systems for achieving precise relative alignments of said printed images, both one to the next in an adjacent manner for first level, and one layer to the next in an aligned manner for second and higher levels, of semiconductive wafer fabrication.

BACKGROUND ART

In the semiconductor industry, lenses of the unit magnification catadioptric type are employed in the processing of semiconductive wafers to form integrated circuits. Very large scale integrated circuits are often fabricated by utilizing a precisely controlled stage to successively position adjacent regions, containing an integral number of individual microcircuits, on a semiconductive wafer with respect to an image (formed by such a projection lens) of a reticle containing a next level of the microcircuitry that is then printed on the semiconductive wafer at each of those regions. This step-and-repeat printing operation forms an array of adjacent regions of microcircuitry on the semiconductive wafer in rows and columns in an ordered parallel and orthogonal manner. Successive processing of the semiconductive wafer and printing of a further level of microcircuitry, aligned with the preceeding processed regions to a high (sub micron) accuracy, are typically employed in the fabrication of integrated circuits from the semiconductive wafer.

One problem peculiar to all optical projection lenses utilized in the processing of semiconductive wafers is the very shallow depth of focus they all possess. As a result each image must be focused before it is printed.

Because of the relatively large image sizes associated with unit magnification catadioptric lenses and the lack of surface planarity of the semiconductive wafers there is also a need to level the circuit side surface of the semiconductive wafer for each region to be exposed prior to the printing of the image of the reticle at that region so that a condition of best focus is obtained over the extent of the region.

In order to facilitate the focusing and leveling of the circuit side surface of the semiconductive wafer irrespective of the size of the wafer and the position of the region of the wafer being leveled, it would be highly desirable to employ a wafer chuck control system which provides vertical position, pitch and roll servo control of the wafer chuck, in decoupled response to inputs from a set of three focus detectors associated with the unit magnification catadioptric lens and positioned in locations surrounding the image of the reticle, to focus and level the plane of the circuit side of the semiconductive wafer prior to exposure. It is necessary to decouple the focus detector inputs from the vertical position, pitch and roll servo controller because, as the region position is varied, the location of each focus sensor relative to each vertical positioning element of the wafer chuck system varies as well. The loop gain associated with each focus detector vertical positioning element servo would change and could even invert by 180° in direction as well, as will be explained hereinafter, if not suitably decoupled. Further, it is sometimes necessary to maintain the plane of the circuit side of the semiconductive wafer in the best focus condition possible with limited information, such as where the region being focused is positioned such that one or even two of the focus sensors are no longer directly above the wafer and provide no information at all.

In order to facilitate the precise positioning of adjacent areas of printed images without aligning each image to a previously printed and processed region on the semiconductive wafer, it would be highly desirable to be able to utilize the wafer chuck control system to maintain the plane of the circuit side surface of the wafer in a known position with respect to the precisely controlled stage as the wafer is leveled prior to exposure. This is especially true if the semiconductive wafer is to be processed in a mix-and-match manner where various types of alignment and exposure systems are utilized for different levels of microcircuitry and the exposed regions may be different for each type of alignment and exposure apparatus.

By way of example, consider the case where the step-and-repeat alignment and exposure system is used for printing the first layer and a scanning projection system, that is able to print the entire semiconductive wafer (with less resolution and accuracy but also with less cost), can then be used to print a later non-critical layer. Another example would be the case where another step-and-repeat alignment and exposure system is used for such a later non-crictical layer but it is desired to globally align the semiconductive wafer, by aligning only two locations, and shoot "blind" in order to save processing time and therefore reduce costs.

Unfortunately, however, many types of step-and-repeat alignment and exposure systems do not provide known position relationships between their wafer chucks and stages. By way of example, consider two prior art wafer chuck support systems as described in U.S. Pat. No. 4,383,757 entitled OPTICAL FOCUSING SYSTEM and issued May 17, 1983 to Edward H. Phillips and the aforementioned U.S. Pat. No. 4,391,494. Both patents illustrate wafer chuck support systems of the kinematically constrained type with the plane of kinematic constraint parallel to but separated a significant distance from the plane of the circuit side surface of the semiconductive wafer. This means that the region of the semiconductive wafer to be printed shifts laterally with respect to the stage as the pitch and roll attitudes of the wafer are modified according to the product of the separation distance and the sine of the differential pitch angle of the chuck. Because of the tolerance on wafer flatness, the magnitude of this product can be many microns ($\mu$m) over the extent of the semiconductive wafer. Such lateral shift is not acceptable in light of the normal alignment figure of 0.1 micron($\mu$m).

The two machines disclosed in the cited patents deal with this problem differently. That of U.S. Pat. No. 4,383,757 does not provide for any wafer leveling once the step-and-repeat process for each semiconductive wafer has begun, while that of U.S. Pat. No. 4,391,494 does not allow any of the troublesome operation sequences, such as mix-and-match or shooting "blind", to be used whenever it is utilized for the photometric printing of the first level of microcircuitry on the semiconductive wafer.

Concomitantly, in order to facilitate an orthogonal relationship between the printed images and the rows and columns of the adjacent regions of microcircuitry of the semiconductive wafer and guarantee layer to layer angular-orientation overlay accuracy, it would also be highly desirable to employ an optical alignment system, including a stage reference sub-system, able to orient the image of the reticle precisely orthogonal to the co-ordinate axes of motion of the stage. This is true for all modes of multi-level semiconductive wafer processing even if all levels are to be printed with the same machine. This is because there is no guarantee that the level of microcircuitry present on each reticle will be angularly oriented precisely the same way with respect to the projection lens, either because that microcircuitry is slightly rotated with respect to the substrate upon which the reticle is formed or because the machine operator improperly mounts the reticle and it is slightly misoriented in its holder.

One prior art system that does have such an optical alignment capability is detailed at great length in U.S. Pat. No. 4,452,526 entitled STEP-AND-REPEAT PROJECTION ALIGNMENT AND EXPOSURE SYSTEM WITH AUXILIARY OPTICAL UNIT and issued June 5, 1984 to Karl-Heinz Johannsmeier and Edward H. Phillips and U.S. Pat. No. 4,473,293 entitled STEP-AND-REPEAT PROJECTION ALIGNMENT AND EXPOSURE SYSTEM and issued Sept. 25, 1984 to Edward H. Phillips. While this prior art system utilizes a projection lens of the reduction type, it does allow direct splitfield microscope viewing of the image of the reticle via a conjugate field forming a viewing port. A splitfield microscope is positioned adjacent to the conjugate field and views the image of the reticle thru the projection lens as it falls on a reference mark that is mounted on the stage. The splitfield microscope is coupled to a viewing binocular head which enables the operator to manually control the servo alignment of the image of the reticle's alignment windows with respect to the stage reference mark. The reticle is mounted on a three axis stage and the recticle stage is manipulated so that the images of the alignment windows are aligned on the reference mark.

The above structure is not practicable in conjunction with unit magnification catadioptric lens systems because of severe space limitations. In such systems it is extremely difficult to mount the reticle of a unit magnification catadioptric lens on a stage of any type, even a single axis rotational one, and indeed, the aforementioned U.S. Pat. No. 4,391,494 does not disclose such a stage. Neither does it disclose any direct viewing of the projected images nor any main stage reference apparatus. Therefore, printed images of that machine's reticle are randomly oriented and generally are not rotationally aligned with respect to the orthogonal axes of motion of its stage.

What is needed is a sub-system of the optical alignment system which can rotate and translate the orthogonal axes of motion of the stage so that the axes of motion of the stage are aligned with the actual position of the image of the reticle.

In order to minimize the time required to perform alignments of the previously printed and processed regions of the semiconductive wafer or the stage reference sub-system with the image of the alignment marks of the reticle, it would also be highly desirable to employ the optical alignment system to generate a two or three dimensional (as required for stage reference sub-system or wafer region alignment, respectively) offset signal proportional to the distance and indicative of the direction, required to move the stage to achieve alignment. The alignment system disclosed in the aforementioned U.S. Pat. No. 4,391,494 is non vectorial in concept and presents no directional information at all. Thus, mechanical displacement is required to generate alignment information and the resulting iterative alignment process is relatively slow in execution.

Finally, to enable the implementation of all of the uses for the optical alignment system, it is necessary to create a viewing port and miniature splitfield microscope for viewing the image of the reticle in a manner similar to that shown in the aforementioned U.S. Pat. No. 4,473,293, by providing a conjugate field, a novel method of microscope objective construction, and novel use of infinity correction in coupling said microscope objective to a utilization device.

Accordingly, it is the principal object of this invention to provide an improved step-and-repeat alignment and exposure system incorporating a projection lens of the unit magnification catadioptric type which allows direct viewing of an image of a first object, such as a reticle, and of a second object such as a stage reference sub-system or such as a semiconductive wafer.

Another object of this invention is to provide a unit magnification catadioptric lens incorporated in the step-and-repeat alignment and exposure system with a viewing port for observing an image plane of the lens.

Another object of this invention is to provide a step-and-repeat alignment and exposure system with a miniaturized microscope utilized in a splitfield manner and employing a novel method of microscope objective construction and use of infinity correction in coupling said microscope objective to a utilization device.

Another object of this invention is to provide the stage of the machine employing a step-and-repeat alignment and exposure system with a stage reference sub-system for providing an alignment reference for an image of the reticle by presenting a stage reference reticle.

Another object of this invention is to provide a step-and-repeat alignment and exposure system with an optical alignment system for generating a multidimensional offset signal proportional to the distance, and indicative of the direction, required to move the stage to achieve a selected alignment of the image of the reticle with either a stage reference mark image or alignment marks on a semiconductive wafer.

Another object of this invention is to provide a step-and-repeat alignment and exposure system with a sub-system for translating and rotating an orthogonal axes of motion of a main stage to achieve compatability with the actual position and orientation of the image of the reticle.

Another object of this invention is to provide a step-and-repeat alignment and exposure system with a subsystem for globally aligning the semiconductive wafer and shooting "blind".

Another object of this invention is to provide a step-and-repeat alignment and exposure system with a subsystem for aligning each previously processed region of the semiconductive wafer to the image of the reticle prior to photometrically printing the image of the reticle on the region.

Another object of this invention is to provide a method of utilizing the apparatus of the invention to calibrate the apparatus.

Another object of this invention is to provide a method of utilizing the calibrated apparatus of the invention to photometrically print first level semiconductive wafers.

Another object of this invention is to provide a method of utilizing the calibrated apparatus of the invention to photometrically print higher level semiconductive wafers.

Another object of this invention is to provide the main stage of a step-and-repeat alignment and exposure system with a wafer chuck system able to regulate the vertical position, pitch and roll of a plane of the circuit side surface of the semiconductive wafer in response to signals from a set of three focus sensors, while maintaining said surface in a known position with respect to the stage, and to provide a sub-system able to provide translational offsets to the stage coordinates along the axes of motion of the stage for maintaining the circuit side of the semiconductive wafer at the addressed stage co-ordinates during wafer region leveling.

Another object of this invention is to provide a stage of a step-and-repeat alignment and exposure system with a wafer chuck system able to maintain the plane of the circuit side of the semiconductive wafer in a controlled position with respect to the stage, and a sub-system adapted to manipulate the controlled position for maintaining precise registration of the circuit side surface of the semiconductive wafer at the addressed stage co-ordinates during wafer region leveling.

Another object of this invention is to provide a stage of the step-and-repeat alignment and exposure system with an extended function wafer chuck system and an electronic sub-system able to provide required rotational motion, for both global and regional semiconductive wafer alignment purposes, about an axis orthogonal to the co-ordinate axes of motion of the stage as well as maintaining precise registration of the center point of the wafer chuck at the addressed stage co-ordinates during both wafer region leveling and said rotational motion.

Still another object of this invention is to provide the wafer chuck system with a sub-system able to decouple a direct servo connection of the wafer chuck system to the set of three focus detectors associated with the unit magnification catadioptric lens and provide vertical position, pitch and roll servo control for achieving and maintaining semiconductive wafer region focusing and leveling irrespective of the size of the semiconductive wafer and the position of the region on the semiconductive wafer.

Still another object of this invention is to provide a method of decoupling the direct servo connection of the wafer chuck system to the set of three focus detectors.

These and other objects, which will become apparent from an inspection of the accompanying drawings and a reading of the associated description, are accomplished by the present invention comprising a main stage controlled for movement in a plane defined by first and second orthogonal axes; a wafer chuck for supporting the semiconductive wafer wherein said wafer chuck is supported on the main stage for rotational positioning about a third axis orthogonal to the first and second orthogonal axes; catadioptric projection lens means for imaging portions of a reticle onto the semiconductive wafer or onto a reference mark associated with the main stage, wherein an optical path is defined through the reticle and lens means; a light source for supplying illumination or exposure light; beam splitter means supplementing the catadioptric projection lens means and positioned along the optical path for viewing a projected conjugate image of the portions of the semiconductive wafer or reference mark which are illuminated by the projected image of the reticle; means for viewing selected portions of the projected conjugate image; and means for utilizing the viewed selected portions of the projected conjugate image.

More specifically, the above are accomplished according to the illustrated preferred embodiments of this invention by providing an improved step-and-repeat alignment and exposure system including a main stage controlled for movement to different positions along orthogonal X and Y axes; a wafer chuck mounted on the main stage and adapted for rotational movement about a third orthogonal Z axis for supporting a semiconductive wafer thereon; an optical sub-assembly mounted on the main stage for imaging a stage reference mark onto the plane of the upper surface, or circuit side, of the semiconductive wafer; a projection lens of the unit magnification catadioptric type for imaging illuminated portions of a reticle onto portions of the semiconductive wafer or the image of the stage reference mark, depending on the position to which the main stage is moved; a light source for directing uniform illumination or exposure light along an optical path extending thru the reticle and the projection lens; a beam splitter fashioned from a component prism of the projection lens for providing a viewing port at which a projected conjugate image of the selected portions of the semiconductive wafer or the image of the stage reference mark, illuminated by the projected image of the illuminated portions of the reticle, may be viewed; a pair of novelly constructed, infinity corrected microscope objectives adapted for viewing selected portions of the projected conjugate image; and coupled, thru a novel use of the infinity correction principal, to a pair of focusing lenses for re-imaging the viewed, selected portions of the projected conjugate image upon a pair of tv camera tubes.

The improved step-and-repeat alignment and exposure system also includes a wafer chuck focusing and leveling system adapted for regulating the vertical position, pitch and roll of the plane of the circuit side surface of the semiconductive wafer, in response to signals from a set of three focus detectors, with a combination of kinematic mounts, vertical drivers and position feedback sensors that together with a control surface in a known position with respect to the main stage and for providing translational offsets to the stage co-ordinates along the axes of motion of the stage for maintaining the circuit side of the semiconductive wafer at a set of addressed stage coordinates during wafer region leveling. In an alternative embodiment, a six degree of freedom support and position feedback sensor system together with an alternative control sub-system are adapted for maintaining the circuit side surface of the semiconductive wafer in precise registration with the set of addressed stage co-ordinates during region leveling.

In still another embodiment, the function of the six degree of freedom support and position sensor system, and the control sub-system is extended, for providing the rotational motion of the wafer chuck about the Z axis as well as maintaining the center of the wafer chuck in precise registration with the set of addressed stage co-ordinates.

The improved step-and-repeat alignment and exposure system also includes another sub-system able to provide a multi-dimensional offset signal proportional to the distance, and indicative of the direction, required to move the stage to achieve a selected alignment of the image of the reticle and either the stage reference mark image or alignment marks on the semiconductive wafer for minimizing stage alignment time; another sub-system able to rotate and translate the X,Y co-ordinate axes of motion of the stage into an offset and rotated U,V co-ordinate axes of motion of the stage for achieving compatability with the actual position and orientation of the image of the reticle; another sub-system able to provide selective decoupling of the set of three focus detectors from the wafer chuck's vertical position, pitch and roll servos for achieving and maintaining semiconductive wafer region focusing and leveling irrespective of the size of the wafer and the position of the region on the wafer; another sub-system able to provide global alignments and subsequent "blind" shooting of the semiconductive wafer for minimizing wafer processing time; and another sub-system able to provide regional alignments and immediate exposure of adjacent regions of a semiconductive wafer for minimizing alignment errors.

BRIEF DESCRIPTION OF THE DRAWINGS

FIG. 1 is an isometric view of the different portions of an improved step-and-repeat alignment and exposure system in accordance with the preferred embodiment of the present invention.

FIG. 2 is a graphic representation of two coordinate systems utilized by a main stage of the improved step-and-repeat alignment and exposure system.

FIG. 3A is a sectional side view of a unit magnification catadioptric lens of the improved step-and-repeat alignment and exposure system.

FIG. 3B is a sectional plan view of the unit magnification catadioptric lens.

FIG. 4 is a graphic representation of a combined object-image field of the unit magnification catadioptric lens as would be present at imaginary line A—A of FIG. 3A.

FIG. 5A is a plan view of a reticle alignment window employed with the improved step-and-repeat alignment and exposure system.

FIG. 5B is a plan view of a wafer alignment mark employed with the improved step-and-repeat alignment and exposure system.

FIG. 6 is a plan view of a first level reticle employed with the improved step-and-repeat alignment and exposure system.

FIG. 7 is a plan view of a region, bounded by solid lines 77, of a semiconductive wafer photometrically printed by the unit magnification catadioptric lens.

FIG. 8A is a plan view of a higher-level reticle employed with the improved step-and-repeat alignment and exposure system for utilization with wafer processing of a positive nature.

FIG. 8B is a plan view of a higher-level reticle employed with the improved step-and-repeat alignment and exposure system for utilization with wafer processing of a negative nature.

FIG. 9 is a plan view of an aligned wafer alignment mark as illuminated by a projected image of the reticle alignment window.

FIG. 10 is a graphic view of a composite signal derived from an alignment sub-system of the improved step-and-repeat alignment and exposure system.

FIG. 11A is a plan view of a wafer mark, misaligned in the X direction, as illuminated by a projected image of the reticle alignment window.

FIG. 11B is a plan view of a wafer mark, misaligned in the Y direction, as illuminated by a projected image of the reticle alignment window.

FIG. 12 is a plan view of a chuck mounting spider of the improved step-and-repeat alignment and exposure system.

FIG. 13 is a sectional view of a support assembly of the improved step-and-repeat alignment and exposure system.

FIG. 14 is an isometric view of a linear drive motor of the support assembly.

FIG. 15 is a sectional view of an alternative support assembly of the improved step-and-repeat alignment and exposure system.

FIG. 16 is a sectional view of another alternative support assembly of the improved step-and-repeat alignment and exposure system.

FIG. 17 is a cross sectional view of a drive motor of the alternative support assembly of FIG. 16.

FIGS. 18A–C are graphic plan views of a semiconductive wafer superimposed upon the chuck mounting spider illustrating three different modes of focusing of the semiconductive wafer.

FIG. 19 is a combined block and schematic diagram of a focus control circuit of the improved step-and-repeat alignment and exposure system.

FIGS. 20A–C are combined block and schematic diagrams of a portion of the focus control circuit of the improved step-and-repeat alignment and exposure system relating to the controls for the support assemblies of FIGS. 13, 15 and 16 respectively.

FIG. 21 is a sectional view of an optical assembly adapted for imaging a stage mark of the improved step-and-repeat alignment and exposure system.

FIG. 22 is a flow chart outlining the procedure followed in utilizing the improved step-and-repeat alignment and exposure system.

FIG. 23 is a plan view of a semiconductive wafer as processed by the improved step-and-repeat alignment and exposure system.

FIG. 24A is a flow chart outlining the procedure followed in loading a wafer and focusing and leveling a region.

FIG. 24B is a flow chart outlining the procedure followed in leveling a region with one or two focus detectors off of the semiconductor wafer.

FIG. 25 is a graphic representation of the geometries and locations of the link members utilized by the improved step-and-repeat alignment and exposure system in constraining the chuck mounting spider.

FIG. 26A is a graphic plan view of a semiconductive wafer superimposed upon the chuck mounting spider illustrating the operation of the alternative support assembly of FIG. 15.

FIG. 26B is a graphic side view of a semiconductive wafer superimposed upon the chuck mounting spider illustrating the effects of chuck tilt.

DESCRIPTION OF THE PREFERRED EMBODIMENTS

Referring now to FIG. 1 there is shown an improved step-and-repeat alignment and exposure system 10 for repeatedly printing one level of microcircuitry, contained on a first object, such as a reticle 12, at an array of adjacent regions of a second object, such as a semiconductive wafer 14, in alignment with other levels of microcircuitry previously printed or yet to be printed at those same regions. The improved step-and-repeat alignment and exposure system 10 includes a slide 16 for holding the reticle 12, a unit magnification catadioptric lens 18 for projecting an image of illuminated portions of the reticle onto the semiconductive wafer 14 or an image point 20 of an optical assembly 22 containing a stage reference mark 24 at its object plane, a main stage 26 for positioning the optical assembly 22 or the semiconductive wafer 14 with respect to the projected image of the illuminated portions of the reticle, a beam splitter 28 for providing a viewing port 30 for viewing projected conjugate images of portions of the semiconductive wafer 14 or the image point 20 illuminated by the projected image of the reticle, a pair of infinity corrected microscope objectives 32a and 32b and a pair of focusing lenses 34a and 34b for imaging selected camera tubes 36a and 36b, respectively, and a light source 38 for illuminating the reticle with either illumination or exposure light for viewing the projected conjugate image or exposing a photosensitive film on the semiconductive wafer, respectively, as determined by the position of an actinic shutter 40, utilized for eliminating the actinic or exposure wavelengths of light whenever exposures are not being made.

Referring now to both FIG. 1 and FIG. 2, main stage 26 may comprise an interferometrically controlled stage of the type shown and described in detail in U.S. Pat. No. 4,311,390 entitled INTERFEROMETRICALLY CONTROLLED STAGE WITH PRECISELY ORTHOGONAL AXES OF MOTION, issued Jan. 19, 1982 to Edward H. Phillips and incorporated by reference herein. As fully described in that patent, main stage 26 may be moved along orthogonal X and Y axes to any position in a horizontal plane by X and Y axes servo drive units 42 and 44 respectively. The co-ordinate X,Y address is determined by the sequential application of the formulas $$x = \tfrac{1}{2}[\cos \theta](\Delta L_1 - \Delta L_2)$$

and $$y = \tfrac{1}{2}[\sin \theta](\Delta L_1 + \Delta L_2)$$

of that patent, where $\Delta L_1$ and $\Delta L_2$ are lengths measured from a predesignated reference point, such as a home position, by a pair of interferometers and $\theta$ is an angle between the Y axis of motion and either of a pair of laser interferometer mirrors of that patent. Normal operation of the stage requires values for $\Delta L_1$ and $\Delta L_2$ to be determined from selected values of X and Y. $\Delta L_1$ and $\Delta L_2$ may be determined by solving these equations for $\Delta L_1$ and $\Delta L_2$ and deriving the formulas $$\Delta L_1 = x/\cos \phi + y/\sin \phi$$

and $$\Delta L_2 = y/\sin \phi - x/\cos \phi.$$

It is apparent that any system of coordinates, U,V, could be utilized for the present system wherein the main stage 26 may be moved to a desired position 11 along offset and rotated U and V axes by the further application of new formulas $$u = (x - \delta x)\cos \phi + (y - \delta y)\sin \phi$$

and $$v = (y - \delta y)\cos \phi - (x - \delta x)\sin \phi,$$

where, as illustrated in FIG. 2, $\delta x$ and $\delta y$ are offsets between the average actual and nominal locations of the images of a pair of alignment windows of reticle 12 along the X and Y axes, respectively, and is the angle between a line joining the actual locations of the images of the pair of alignment windows of reticle 12 and the X axis. This offset and rotated system of co-ordinates is utilized in controlling the position of main stage 26 once the reticle's position has been calibrated, as hereinafter explained.

Referring now to FIGS. 1, 3A, 3B and 4, unit magnification catadioptric lens 18 can comprise a Dyson-Wynne imaging system of the type shown and described in detail in the aforementioned U.S. Pat. No. 4,391,494 incorporated by reference herein. As fully described in that patent, composite achromatprism assembly 46 includes prisms 48 and 50 as necessary parts of the optical design and serve the useful function of physically separating its object plane 60 from its image plane 54 via internal reflections from the prism diagonal surfaces 48a and 50a from and toward the reticle 12 and wafer 14 or image point 20 respectively. Light reflected from selected points on the wafer such as alignment marks 52a and 52b within image field 55 on image 57 of reticle 12 is transmitted back along optical path 56a, 56b, 56c and 56d and imaged at points 58a and 58b, respectively, in an object field 61 of FIG. 4 where FIG. 4 shows the combined object-image field as it would appear at imaginary line A—A of FIG. 3A if prisms 48 and 50 were made without diagonal surfaces 48a and 50a but were of the same optical length.

As shown in FIG. 3A, diagonal surface 48a may be coated with a multilayer "cold mirror" dielectric filter to form a highly reflective surface for the actinic wavelengths and simultaneously a 50-50 beamsplitter for a viewing illumination wavelength of 546 nm, generated by the "F" line of a mercury arc lamp 62 utilized in light source 38, in conjunction with an additional prism 64. Thus optical path 56e is created for the viewing light as an extension of optical path 56c and creates viewing port 30.

These means utilized for creating the viewing port differ substantially from means utilized in the aforementioned U.S. Pat. No. 4,473,293, incorporated by reference herein, to create a viewing port of that patent. That viewing port was created by adding a cube beamsplitter between an object plane and an imaging lens of that patent. This required a custom optical design for the imaging lens to compensate for the spherical distortion introduced by the cube beamsplitter. It also required the actinic wavelengths to pass thru the beam-splitting surface and precluded the use of an efficient "cold mirror" beamsplitter. The use of a standard beamsplitting coating of 20% reflection was chosen for the cube beamsplitter and this resulted in a 20% loss of the actinic wavelength energy and a concomitant 25% increase in exposure times. Choosing the beamsplitting ratio at 20% had the further side effect of substantially reducing the amount of viewing light available (by comparison with a 50-50 beamsplitter) at the viewing port and making viewing by microscope more difficult.

In order to create the present viewing port in a distortion-free manner prism 64 must be made from the same material as prism 48. However, it is reduced in optical path length as compared with prism 48. Since the total optical path to a pair of projected, conjugate images 58$a'$ and 58$b'$ must be identical to the optical path to the reticle to avoid introducing spherical aberation, combination prism-lenses 66$a$ and 66$b$, also made of the same material as prism 48, are introduced and internally form projected, conjugate images 58$a'$ and 58$b'$. They have 45° diagonal surfaces which function as 90° beam benders by the well known method of total internal reflection and bend the light transmitted along paths 56$e'$ and 56$e''$ and internally form projected, conjugate images 58$a'$ and 58$b'$ along optical paths 56$f'$ and 56$f''$ respectively. Working clearances 68$a$ and 68$b$ are identical in length to the principal working distance of unit magnification catadioptric lens 18; i.e., between the prism 48 and object plane 60 and allow mechanical motion as explained hereinafter.

The unit magnification catadioptric lens of incorporated U.S. Pat. No. 4,391,494 is limited in that it is not chromatically corrected to a high degree. Thus, images formed with light of 546 nm are somewhat out of focus. This out of focus condition may actually be helpful in the functioning of the analog alignment system of that patent. A more highly corrected unit magnification catadioptric lens of the same generic type which is found in U.S. Pat. No. 4,171,871 entitled ACHROMATIC UNIT MAGNIFICATION OPTICAL SYSTEM, issued Oct. 23, 1979 to Frederick H. Dill, Raymond E. Tibbetts and Janusz S. Wilczynski and incorporated by reference herein, can be utilized instead of the unit magnification catadioptric lens of U.S. Pat. No. 4,391,494 to improve the viewed image quality and the resolving power of the microscope.

Magnified images of the projected conjugate images 58$a'$ and 58$b'$ are formed on the tv camera tubes 36$a$ and 36$b$ by the combination of infinity corrected microscope objectives 32$a$ and 32$b$ and focusing lenses 34$a$ and 34$b$, respectively. Objective 32$a$ comprises that portion of a transparent sphere formed by the portion of prismlens 66$a$ between image 58$a'$ and convex surface 70$a$ and doublet 72$a$. Similarly, objective 32$b$ comprises that portion of a transparent sphere formed by the portion of prism lens 66$b$ between image 58$b'$ 70$b$ and doublet 72$b$. The transparent spheres may be visualized by observing dotted lines 71$a$ and 71$b$. An axial length, -s, between image 58$a'$ and convex surface 70$a$, or image 58$b'$ and convex surface 70$b$ is chosen according to the formula $$-s = r(n+1)/n.$$

Virtual images of images 58$a'$ and 58$b'$ are formed at an axial length, s', in front of the convex surfaces 70$a$ and 70$b$, respectively according to the formula $$s' = r(n+1).$$

These virtual images are analogous to those formed by the first element of high power microscope objectives of the oil immersion type and are free of both spherical aberation and coma. Doublets 72$a$ and 72$b$ are virtual images, to comprise the remainder of the positioned with their focal points coincident with the infinity corrected objectives 32$a$ and 32$b$. Infinity corrected objectives 32$a$ and 32$b$ may be translated anywhere along orthogonal axes p' and q' and p'' and q'' within image field 55, subject to the obvious limitation that they cannot physically interfere with each other, by p', p'', q', and q'' servo drive units 74$a$, 74$b$, 76$a$ and 76$b$ respectively. The servo drive units position the infinity corrected objectives along p' and q' axes and p'' and q'' axes by utilizing two axes stages (not shown) with position feedback provided by position measuring transducers such as linear potentiometers (not shown) and controlled by a computer (not shown).

The computer can be an appropriately programmed general purpose computer, or a programmed microprocessor driven computer system. Microprocessor programming techniques suitable for implementing the equations and methods disclosed herein are well known in the industry, and in addition, are competently taught in a series of study courses entitled "TEACH YOURSELF MICROPROCESSORS" available from Integrated Computer Systems of Los Angeles, Calif. The courses making up the series are course 525A "Software and Hardware", course 536A "Interfacing Applications", and course 550 "Programming in Basic."

Focusing lenses 34$a$ and 34$b$ have clear apertures large enough to pass all of the light transmitted along optical paths 56$f'$ and 56$f''$, respectively, regardless of the positions of the infinity corrected objectives. Since the light passing between infinity corrected objectives 32$a$ and 32$b$ and focusing lenses 34$a$ and 34$b$ is colimated, axial motion between them has no effect on the location or character of images formed by the focusing lenses as is well known and widely used in the microscope industry. One pertinent example of such use is the model MJM splitfield microscope manufactured by Carl Zeiss and utilized in semiconductive wafer aligners for alignment viewing for many years. Not used in the industry or taught in the literature, however, to the knowledge of the applicant, is the fact that lateral motion between the infinity corrected objectives and focusing lenses has no effect on the location or character of the images formed by the focusing lenses either and use is made of this new principle herein to accommodate transverse motion of the infinity corrected objectives without concomitant motion of either the focusing lenses or the images formed by the focusing lenses. Thus, the combination of infinity corrected objectives 32$a$ and 32$b$ and focusing lenses 34$a$ and 34$b$, faithfully form magnified images of images 58$a'$ and 58$b'$ on tv camera tubes 36$a$ and 36$b$. The magnification provided is substantially equal to the ratio of the focal lengths of the focusing lenses 34$a$ and 34$b$ to the focal lengths of the doublets 72$a$ and 72$b$ respectively. Normal programming procedures for the improved step-and-repeat alignment and exposure system 10 include positioning the infinity corrected objectives such that images 58$a$ and 58$b$ coincide with light returning from areas on the semiconductive wafer 14 or the image point 20 that are to be aligned, as hereinafter explained.

Referring now to FIG. 5A and FIG. 5B, there are shown a reticle alignment window 76 and a wafer alignment mark 78 respectively. The reticle alignment window is located on reticle 12 and consists of an orthogonal pair of 20 μm wide by 40 μm tall rhomboid shaped windows with 45° oblique angles and an overall width of 125 μm. The wafer alignment mark is formed on the semiconductive wafer 14 and consists of an orthogonal pair of 5 μm wide by 60 μm tall rhomboid shaped lines with 45° oblique angles and an overall width of 130 μm. FIG. 6 shows a first level reticle containing an array of two reticle alignment windows 76' and 76" and 2(N−1) windows 80' and 80". The 2(N−1) windows 80' and 80" are suitable for printing 2(N−1) wafer alignment marks 78' and 78" in each region of the semiconductive wafer, in a photosensitive emulsion coated on the semiconductive wafer, as shown in FIG. 7, followed by an etching process that permanently etches the wafer alignment marks, or alternately the area immediately surrounding the wafer alignment marks, into the semiconductive wafer, where N equals the total number of levels of microcircuitry necessary to complete the semiconductive regions on the semiconductive wafer.

Thus each succeeding level of microcircuitry can be aligned and printed with reticles utilizing two reticle alignment windows 76' and 76" as shown in FIG. 8A or two reticle alignment windows 76' and 76" and 2(N−M) rectangular windows 82' and 82", 70 μm by 140 μm in size, as shown in FIG. 8B, where M equals the particular level of microcircuitry being printed.

It is necessary to have individual wafer alignment marks for each level of microcircuitry beyond the first because the aligned image of the reticle alignment windows overlays the particular pair of wafer alignment marks during exposure and they are distorted or even consumed during processing used for said level. Concomitantly, it is necessary to locate succeeding level reticle alignment windows at adjacent positions, in a progressive manner, for succeeding levels to utilize succeeding wafer alignment marks for alignment of said levels. Further, it is necessary to protect unused wafer alignment marks during processing at all levels other than the final level. Thus, reticles having reticle alignment windows 76' and 76" according to FIG. 8A would be used whenever that level's processing is of a positive nature, to protect the remaining wafer alignment marks 78' and 78" from being etched during that processing thru windows opened wherever exposures have been made. Reticles having reticle alignment windows 76' and 76" and 2(N−M) rectangular windows 82' and 82" according to FIG. 8B would be used whenever that level's processing is of a negative nature, to protect the remaining wafer alignment marks 78' and 78" from being etched during that level's processing thru windows left wherever exposures have not been made.

Viewing illumination wavelength (546 nm) light is utilized for wafer region alignment to avoid random region exposure during alignment. Referring to FIGS. 6–8, the various alignment windows and marks are suitably positioned to be utilized for such semiconductive wafer region alignment, two for each layer, as follows. The light imaged by reticle alignment windows 76' and 76" takes the form of two sets of rhomboid shaped, illuminated areas 84a and 84b. These areas 84a and 84b are aligned equally about a selected pair of sets of the wafer alignment marks 78a and 78b, as shown in FIG. 9. Thereafter, those two sets of marks are destroyed during that level's processing as described hereinbefore. During the alignment phase associated with each region's alignment and subsequent exposure, an image of the pattern shown in FIG. 9 will be projected onto tv camera tubes 36a and 36b by objectives 32a and 32b and focusing lenses 34a and 34b. The light energy envelope associated with that pattern will be sampled by a sequence of camera scan lines 86. Each scan line sweeps across the pattern and "sees" differing light intensities across each window. The light reflected by the wafer alignment mark may be lighter or darker than the surrounding wafer area as the wafer alignment mark generally is formed as an etched window between layers and the reflected light intensity varies with layer material and thicknesses randomly chosen with respect to the mark and surrounding area. Scattered light from the slopes on the edges of the mark generally reflects away from the aperture of the unit magnification catadioptric lens and results in dark lines at the image of the edges of the mark.

The sequence of scan lines is interrogated for intensity versus time by starting a timing sequence at the start of each window, stopping it at the end of each window, averaging a number of scans, presenting a composite signal envelope 88 and determining a set of values of time $\Delta t_1$, $\Delta t_2$, $\Delta t_3$ and $\Delta t_4$ of FIG. 10. It is to be noted that these time values represent the elapsed time between the edge of rhomboid shaped area 84a or 84b, as indicated by marked change in intensity, and the edge of mark 78' or 78", as indicated by another marked change in intensity.

A two dimensional error signal, suitable for reticle alignment, such as where a stage alignment mark is aligned with the image of a reticle alignment window, is obtained by a computer of the system (not shown) from the following proportionalities:

$$\delta u \, \alpha \, (\Delta t_1 - \Delta t_2) + (\Delta t_3 - \Delta t_4)$$

and $$\delta v \, \alpha \, (\Delta t_1 - \Delta t_2) - (\Delta t_3 - \Delta t_4).$$

Non zero examples of δu and δv are shown in FIG. 11A and FIG. 11B respectively. A three dimensional error signal, suitable for wafer region alignment, such as where the wafer alignment marks of a region of the semiconductive wafer are aligned with the image of the reticle alignment windows, is obtained from the following proportionalities:

$$\delta u \, \alpha \, [(\Delta t_1' - \Delta t_2') + (\Delta t_3' - \Delta t_4')] + [(\Delta t_1'' - \Delta t_2'') + (\Delta t_3'' - \Delta t_4'')],$$

$$\delta v' \, \alpha \, (\Delta t_1' - \Delta t_2') - (\Delta t_3' - \Delta t_4')$$

and $$\delta v'' \, \alpha \, (\Delta t_1'' - \Delta t_2'') - (\Delta t_3'' - \Delta t_4'')$$

where $\Delta t_1'$, $\Delta t_2'$, $\Delta t_3'$, $\Delta t_4'$ and $\delta v'$ are associated with optical path 56f', projected image 58a' and tv camera tube 36a, and $\Delta t_1''$, $\Delta t_2''$, $\Delta t_3''$, $\Delta t_4''$ and $\delta v''$ are associated with optical path 56f'', projected image 58b' and tv camera tube 36b. Thus, δu is associated with both images 58a' and 58b'; δv' is associated with image 58a' only; and δv'' is associated with image 58b' only.

The scheme, detailed hereinabove, utilizing the chevron oriented, rhomboid shaped, superpositioned marks and windows is not presented as new material. It has been utilized as an alignment technique, in conjuction with tv systems, previously and is considered a standard method, in the public domain, at this time. It has been presented in detail herein because the applicant is unaware of a concise description of it in the patent literature.

In order to align the semiconductive wafer by reducing δu, δv' and δv" simultaneously to zero it is necessary to add a third degree of freedom of motion to the semiconductive wafer 14 wherein the wafer is allowed to rotate about a third orthogonal Z axis by positioning the wafer upon a chuck 90, supported above a rotational Ψ platform 92 by three support assemblies 94a, 94b and 94c, and rotationally located by a Ψ axis drive unit 96 as shown in FIG. 1 and rotationally positioned by the Ψ axis drive unit as described hereinafter.

Thus, servo drive units 42 and 44 and Ψ axis drive unit 96 permit the positioning of the semiconductive wafer 14 within a plane parallel to the plane of stage 26.

Semiconductive wafers may be found to have as much as a 100 μm difference in height from one edge to another and still satisfy the specifications of the Semiconductor Equipment and Materials Institute. In order to compensate for this variable thickness characteristic of semiconductive wafers and achieve a best focus condition for each semiconductive wafer region, it is necessary to provide three more degrees of freedom to the semiconductive wafer wherein the wafer is allowed to vary its vertical position, pitch and roll locations by controlled positioning of support assemblies 94a, 94b and 94c in the Z direction.

Referring now to FIG. 12, there is shown a chuck mounting spider 98 supported by the three support assemblies 94a, 94b and 94c and located by spring like L-shaped link member 100 and spring like elongated link member 102 on Ψ platform 92. Ψ platform 92, spider 98, L-shaped link member 100, and elongated link member 102 form three constraints of a kinematically constrained assembly, functionally identical to a kinematic differential leveling and positioning apparatus described in detail in the aforementioned U.S. Pat. No. 4,383,757 incorporated by reference herein.

Three other constraints are provided by the aforementioned support assemblies 94a, 94b and 94c, which are identically constructed, as shown in FIG. 13. Each assembly is a position controlling servo-mechanism comprising a balanced set of moving coil linear motors 104' and 104", which are supported relative to platform 92 and shown in FIG. 14. These function in a manner analogous to a voice coil in a loud speaker. The linear motors 104' and 104" provide three drive points 103 each, and are coupled at these points to a spider support bar 106 by three cap screws 101 each. Suitable moving coil linear motors include Model No. NCT2750201020, manufactured by Northern Magnetics of Van Nuys, Calif. Alternately, moving magnet linear motors can be utilized for linear motors 104' and 104". Suitable moving magnet linear motors include Model No. NMT2750201020, also manufactured by Northern Magnetics, Inc.

The linear motors are electrically series connected and drive the spider support bar 106 in the same direction and with the same thrust. The spider support bar position is monitored by a linear voltage differential transformer "LVDT" 108. The shaft 108' of LVDT 108 is affixed to support bar 106 so that the shaft 108' moves with the support bar relative to the LVDT body 108". Linear voltage differential transformers are discussed in detail in "Handbook of Measurement and Control" published by the Schaevitz Engineering Corporation of Pennsauken, N.J. Each spider support bar 106 is fastened to one corner, e.g. 93, of the chuck mounting spider 98 by two cap screws 105 to enable its respective support assembly, e.g. 94a, to support that corner of the chuck mounting spider 98.

FIG. 15 shows an alternative embodiment to the combination of L-shaped link member 100, elongated link member 102 and support assemblies 94a, 94b and 94c. In this alternative embodiment, support assemblies 94a, 94b and 94c are each replaced by new support assemblies 94a', 94b' and 94c', which are identically constructed, as shown in FIG. 15. These new support assemblies together with spider 98 form a free floating support platform having six degrees of freedom whose maximum travel is limited only by the operating clearances of the various component parts of support assemblies 94a', 94b', and 94c'. Each of the support assemblies is a two degree of freedom, position controlling servo-mechanism. Moving coil linear motors 110' and 110" are oriented orthogonally to one another and at an oblique angle of 45° to the plane of stage 26 and are coupled to support block 107 with three cap screws 109.

Support block 107 has a triangular cross section, with a horizontal top surface, and side surfaces angled to be parallel to the adjacent faces of moving coil linear motors 110' and 110". Altered spider support bar 106' includes apertures 113 which accept and secure shafts 115' and 115" of LVDT 112' and 112", respectively.

The support block 107 is coupled to the spider support bar 106' by cap screws (not shown) and the spider support bar 106' is coupled to the chuck mounting spider 98 as before. LVDT's 112' and 112" are provided and also oriented orthogonally to one another and at the same oblique angle of 45° to the horizontal plane. Thus, moving coil linear motors 110' and 110" are electrically independent and each provides thrust that results in motion of the chuck mounting spider 98 generally along its axis. Such motion is closely monitored by LVDT's 112' and 112", respectively.

The center lines of the coil structures 114' and 114' of LVDT's 112' and 112" define axes of motion S and T which are coincident at point O on image plane 54 of the unit magnification catadioptric lens 18. Thus, whenever moving coil motors 110' and 110" are controlled such that the differential output, $s - t = 0$, there can be no lateral shift of any object associated with chuck mounting spider 98 at point O on image plane 54. Since there are three such points, $O_a$, $O_b$ and $O_c$, associated with support assemblies 94a', 94b' and 94c' it is evident that the chuck mounting spider is constrained from motion in the X or Y direction and rotation about the Z axis with respect to rotational Ψ platform 92 at the image plane 54.

Referring to FIG. 26A, there is shown a plan view of semiconductive wafer 14 superimposed upon a triangular frame 122 symbolically representing spider 98. As noted hereinbefore, the spider is located in the U, V and Ψ directions with respect to main stage 26 by support assemblies 94a', 94b' and 94c'. These are symbolically represented by fixed portions 180a, 180b and 180c and supported portions 182a, 182b, and 182c, which are in turn coupled to the spider as also noted hereinbefore. Since there can be no lateral shift of any of the points $O_a$, $O_b$ or $O_c$, associated with each of the support assemblies, it is evident that each must be located on radial planes 184a, 184b and 184c, respectively. The radial planes intersect at line 186, and the intersection of line 186 and the image plane 54 defines a point that does not move with respect to the rotational Ψ platform.

When semiconductive wafer 14 is mounted on the chuck and properly in focus, the center of the semiconductive wafer is also located at this point and does not move with respect to the rotational Ψ platform. Also, since the radial planes cannot rotate, it is clear that the semiconductive wafer is constrained from relative motion around the Z axis as well. FIG. 26B shows that it is possible for points on the surface of the semiconductive wafer that are not near its center can shift radially by a cosine relationship. This possible shift is very small in magnitude, however, as the following examples shows.

Assume a chuck tilt angle ($\gamma$) of 0.001 radian (100 $\mu$m wedge on a 100 mm diameter wafer) and a 50 mm radius, then $$R_w = R_w(1 - \cos\gamma) = 50(1 - .9999995)$$
$$= .000025 \text{mm} = .025 \mu\text{m}.$$

Thus, it is evident that the wafer is effectively constrained from relative motion in the X and Y directions as well.

Further, wafers typically fall within a range of thicknesses of 100 $\mu$m as well and since the operating clearances of the various component parts of support assemblies 94a', 94b' and 94c' are at least 1000 $\mu$m it is also clear that they together with spider 98 do indeed form a free floating platform as described hereinbefore.

Thus, a non shifting, non rotating horizontal plane coincident with the image plane 54 of unit magnification catadioptric lens 18 is defined while the spider 98 may concomitantly be positioned in vertical position, pitch and roll according to $$z_a = (s_a + t_a) \cos 45°,$$

$$z_b = (s_b + t_b) \cos 45°$$

and $$z_c = (s_c + t_c) \cos 45°,$$

and position the semiconductive wafer region being aligned or exposed in a condition of best focus as well as precise registration with the addressed stage co-ordinates.

FIG. 16 shows an alternative embodiment to support assemblies 94a', 94b' and 94c' wherein the operating up so that it is possible to add a lateral motion clearances of the various components have been opened function to each of these assemblies and generate a coordinated tangential motion of new support assemblies 94a'', 94b'' and 94c'' according to $$\Psi = \arctan(s_a - t_a)\cos 45°/R$$
$$= \arctan(s_b - t_b)\cos 45°/R$$
$$= \arctan(s_c - t_c)\cos 45°/R$$

and thus replace rotational Ψ platform 92 and Ψ axis drive unit 96. More specifically, the enlarged lateral operating range of these assemblies permit tangential motion at the periphery of the spider. This motion is, in effect, a rotational motion suitable for positioning the semiconductive wafer about the Z axis.

Since the increased operating clearances are required in a tangential direction only it is possible to make the linear motor components rectangular in axial cross section as shown in FIG. 17, and maintain similar design parameters in a relatively compact size. Furthermore, large clearance LVDT's are available commercially as typified by the Large Bore-Small Core Diameter, XS-A series manufactured by the aforementioned Schaevitz Engineering Corporation of Pennsauken, N.J.

Referring to FIG. 18A, there is shown a plan view of semiconductive wafer 14 superimposed upon a triangular frame 122 symbolically representing spider 98. As noted before, in the primary embodiment, the spider is located in the U, V and Ψ directions with respect to main stage 26 in a known manner, by L-shaped link member 100 and elongated link member 102, while it is supported vertically by support assemblies 94a at a, 94b at b and 94c at c which include vertically oriented LVDT's 108a, 108b and 108c and vertically oriented linear motors 104'a, 104''a, 104'b, 104''b, 104'c and 104''c respectively. Shown entirely within the triangular frame 122 is image field 55 surrounded by a group of three focus detectors 124, 126 and 128 located at d, e and f respectively. The focus detectors 124, 126 and 128 are physically mounted to the housing (not shown) of the unit magnification catadioptric lens 18 and are adjusted so that their output null points occur when the wafer is conincident with image plane 54. The focus detectors determine the displacement and direction of displacement required to bring the point being examined into image plane 54 of the unit magnification catadioptric lens 18 and may be of any standard proximity type, such as capacitive probes or pneumatically actuated transducers, but the X,Y co-ordinates of each of the detectors and their electrical output characteristics must be known and will in fact be programming inputs to the computer as hereinafter described.

The computer determines the position of each of the locations d, e and f with respect to triangular frame 122 by a set of three new co-ordinates g, h and j where g is defined as the locational fraction of the orthogonal distance from the line between locations a and b and location c; h is defined as the locational fraction of the orthogonal distance from the line between locations b and c and location a; and j is defined as the locational fraction of the orthogonal distance from the line between locations c and a and location b. For instance, the center of the triangular frame would be located at $g = h = j = \frac{1}{3}$.

The location of points d, e and f are known with respect to the optical axis of the image plane of the unit magnification catadioptric lens 18, and have fixed x,y coordinate addresses. The location of points a, b, and c are known with respect to the stage and are therefore defined in the U,V system of coordinates. The u,v addresses of points a, b, and c are then converted into x,y addresses. From the x,y addresses for points a, b, c, d, and f the g, h, and j, coordinates for each of these points can be calculated, as defined above, in a normal manner.

Intuitively, it can be seen that an upward motion of any of the locations a, b or c will result in an upward motion of semiconductive wafer 14 at all of the locations d, e and f when these locations are within the triangular frame as shown in FIG. 18A wherein the focus sensor located at d has locational co-ordinate values of g=0.27, h=0.46 and j=0.27. If the semiconductive wafer is larger in radius than a value equivalent to $g = h = j = \frac{1}{3}$ it is possible for locations d, e or f to fall outside the triangular frame 122 as is shown in FIG. 18B. In the case illustrated, locations d and f are outside the line between locations a and c thus $z_d<0$ and $z_f<0$.

Concomitantly, it is intuitively obvious that an upward motion of location b will result in a downward motion of locations d and f for the case illustrated in FIG. 18B.

Mathematically, the relationships between $z_d$, $z_e$ and $z_f$ and $g_d$, $g_e$, $g_f$, $h_d$, $h_e$, $h_f$, $j_d$, $j_e$, $j_f$, $z_a$, $z_b$ and $z_c$ are as follows:

$$z_d = g_d z_c + h_d z_a + j_d z_b$$

$$z_e = g_e z_c + h_e z_a + j_e z_b$$

$$z_f = g_f z_c + h_f z_a + j_f z_b.$$

In operation, the focus detectors monitor the location of the top surface of the semiconductive wafer with respect to image plane 54 in a manner analogous to that shown in FIG. 8 of aforementioned and incorporated U.S. Pat. No. 4,383,757. The computer receives $z_d$, $z_e$ and $z_f$ as inputs and is required to issue corresponding values of $z_a$, $z_b$ and $z_c$ as instructions to the three support assemblies to be matched by the controlled outputs of the three LVDT's. The computer does this by evaluating the following determinant ratios:

$$z_a = \frac{\begin{vmatrix} g_d & z_d & j_d \\ g_e & z_e & j_e \\ g_f & z_f & j_f \end{vmatrix}}{\begin{vmatrix} g_d & h_d & j_d \\ g_e & h_e & j_e \\ g_f & h_f & j_f \end{vmatrix}}$$

$$z_b = \frac{\begin{vmatrix} g_d & h_d & z_d \\ g_e & h_e & z_e \\ g_f & h_f & z_f \end{vmatrix}}{\begin{vmatrix} g_d & h_d & j_d \\ g_e & h_e & j_e \\ g_f & h_f & j_f \end{vmatrix}}$$

$$z_c = \frac{\begin{vmatrix} z_d & h_d & j_d \\ z_e & h_e & j_e \\ z_f & h_f & j_f \end{vmatrix}}{\begin{vmatrix} g_d & h_d & j_d \\ g_e & h_e & j_e \\ g_f & h_f & j_f \end{vmatrix}}$$

Referring now to FIG. 19, there is shown a combined block and schematic diagram of a focus position control circuit 130. The computer 132 receives the outputs of focus detectors 124, 126 and 128 as noted before and computes the required values of $z_a$, $z_b$ and $z_c$ in order to place the addressed region in a position of best focus. These values are stored in a bank of registers 134, 136 and 138 respectively; converted to analog signals by a bank of D/A converters 140, 142 and 144 respectively; and applied as inputs to a bank of summing junctions 146, 148 and 150 thru input networks 152, 154 and 156 respectively. A bank of amplifiers 158, 160 and 162 drives pairs of motors 104'a and 104'a, 104'b and 104"b, and 104'c and 104"c. In turn, the pairs of motors concomitantly position LVDT's 108a, 108b and 108c respectively. Each servo loop is closed by applying the outputs of LVDT's 108a, 108b and 108c to the summing junctions 146, 148 and 150 thru input networks 164, 166 and 168 respectively. Input networks 152, 154 and 156 can be gain setting resistors, for example. Input networks 164, 166 and 168, and feedback networks 170, 172 and 174 can generally be higher order passive compensation networks. Finally, the position control loop gains are set with suitable feedback networks 170, 172, and 174 respectively.

It is necessary to decouple the focus detector inputs from the support assembly servo controls, because the resulting system loop gains would vary excessively or even invert, as noted hereinbefore. The computer accomplishes the required decoupling in the following manner: When main stage 26 moves to a new position the computer is programmed to wait for an adequate time for the focus detectors to stabilize their outputs. Then the computer samples these outputs, computes the required $z_a$, $z_b$ and $z_c$ values and loads registers 134, 136 and 138 with said values. Thus the computer acts as an open loop, feed forward device in that it merely sets new reference offsets for the active servo loops.

Referring to FIG. 18C there is shown yet another possible case where one or more of focus detectors 124, 126 or 128 may not even be positioned over the semiconductive wafer. For this case the computation scheme detailed before breaks down since there is no meaningful data from one or more of the focus detectors. The computer has been programmed with the semiconductive wafer's size, however, and simply executes a different program when one or more of the focus detectors is not over semiconductive wafer 14. Pursuant to this different program, the computer merely averages any changes in focus information received from the focus detector(s) still positioned over the semiconductive wafer and commands a corresponding $z_a = z_b = z_c$ thus maintaining the last planerization known and achieving the best focus possible with the focus detection data available.

The above discussion assumes that the geometrical arrangement of FIG. 12 is utilized to support and locate the triangle frame 122. In this case, it is necessary to make a stage offset calculation due to chuck tilt and another due to the foreshortening of the L-shaped and elongated link members as they flex to accommodate changing values of $z_a$, $z_b$ and $z_c$. The computer must also modify the x and y address of main stage 26 and the rotational $\Psi$ platform 92 to compensate. The factors relating to these offsets are discussed in greater detail hereinafter with reference to FIG. 24A, FIG. 24B and FIG. 25.

If the alternative embodiment of FIG. 15 is utilized this problem is resolved, as noted hereinbefore, but the addition of a second LVDT to each servo loop requires some modifications to the control circuit of FIG. 19. In order to see the changes required in each of the servo loops more clearly a portion 176, FIG. 19, of the focus position control circuit 130 is reproduced in FIG. 20A. In the embodiment of FIG. 13, motors 104'a and 104"a are connected in series and act directly upon LVDT 108a and there is a unidimensional change in LVDT output for any displacement. In the alternative embodiment of FIG. 15, motors 110'a and 110"a are actuated differentially.

Referring now to FIG. 20B, the differential control nature of the physical arrangement of motors 110'a and 110"a and LVDT's 112'a and 112"a becomes apparent. As noted hereinbefore, there can be no lateral shift of point O. This means that the two motors must be differentially controlled to make the output signals of the two LVDT's identical by positioning the moving element of the support assembly in a centered relationship with the center lines of the coil structures of the LVDT's. Should the LVDT signal at circuit point 178' be different from the LVDT signal at circuit point 178" then different outputs from amplifiers 158' and 158" will be required since the voltages at summing junctions 146' and 146" must at all times be identically zero. These different outputs will then differentially drive motors 110'a and 110"a so as to reposition the cores of LVDT's 112'a and 112"a in order to force the LVDT output signals at the circuit points 178' and 178" to become equal.

Concomitantly, the computer additionally calculates the required values stored in registers 134, 136 and 138 by solving the equations given hereinbefore with relation to FIG. 15 for $s_a$, $t_a$, $s_b$, $t_b$, $s_c$ and $t_c$ as follows:

$$s_a = t_a = \tfrac{1}{2} z_a / \cos 45°,$$

$$s_b = t_b = \tfrac{1}{2} z_b / \cos 45°$$

and $$s_c = t_c = \tfrac{1}{2} z_c / \cos 45°.$$

Referring now to FIG. 20C, because motion in the lateral direction is permitted, extended differential controls are required for the alternative embodiment of FIG. 16. These comprise the bifurcation of each support assembly's computer output into two registers 134' and 134" and two D/A converters 140' and 140" respectively according to the following equations:

$$s_a = \tfrac{1}{2}(z_a + R \tan \Psi)/\cos 45°,$$

$$t_a = \tfrac{1}{2}(z_a - R \tan \Psi)/\cos 45°,$$

$$s_b = \tfrac{1}{2}(z_b + R \tan \Psi)/\cos 45°,$$

$$t_b = \tfrac{1}{2}(z_b - R \tan \Psi)/\cos 45°,$$

$$s_c = \tfrac{1}{2}(z_c + R \tan \Psi)/\cos 45°$$

and $$t_c = \tfrac{1}{2}(z_c - R \tan \Psi)/\cos 45°.$$

The simplified flow chart of FIG. 24A outlines the procedure followed in loading a wafer and focusing and leveling a region. Following the procedure outlined the chuck is lowered and we load the wafer (the chuck is lowered so the wafer will be sure to clear the proximity sensors). The chuck is then rotated by $\Psi = \phi$ (to align the wafer rotationally with respect to the image of the reticle as described hereinafter) and the stage moved to the address of a region where $z_d$, $z_e$ and $z_f$ are measured. The computer then calculates $z_a$, $z_b$ and $z_c$ and the support assemblies are driven vertically to a position where the LVDT outputs match the calculated values of vertical displacement required to bring the addressed region into focus. If the chuck utilizes link constraints, $\delta x$, $\delta y$ and $\delta \Psi$ offsets are calculated to accommodate chuck tilt and link foreshortening; the stage and rotational $\Psi$ platform are moved in accordance with these offsets; and the wafer focusing and leveling are verified. The nature of the calculations can be illustrated by the following examples:

The larger offset will usually be due to chuck tilt. For instance, assume a chuck tilt of 0.001 radian (100 μm wedge on a 100 mm diameter wafer) together with a 1.000 inch vertical separation of the image and link planes. This will result in a 0.001 inch or 25.40 μm offset in the direction of the tilt. This calculation seems simple but because of the very large magnitude of the offset it must be made with extreme precision. The corresponding calculation for the offset due to link foreshortening is more difficult but results in corrections smaller by perhaps two orders of magnitude. Consider the following example:

Let each link be 3.000 inches long and be located 2.500 inches radially from the center of rotation of the platform as shown in FIG. 25. Assume that the chuck remains horizontal but moves vertically 0.005 inch from an orientation resulting in horizontal (and therefore straight) links. Each link then assumes the shape of a beam built in at both ends with each half of the beam deflecting according to $(0.75m^2 - m^3/6)$ with a slope of $(0.0025/1.125)$ $$(0.0025/1.125)(0.75m^2 - m^3/6)$$

with a slope of $(0.0025/1.125)(1.5 m - m^2/2)$. The foreshortening that results is calculated as follows:

$$m = (.0025/1.125)^2 \int_0^{1.5} (2.25 m^2 - 1.5 m^3 + .25 m^4) dm$$

$$= (.00000494)(1.265625) = .00000625 \text{ inch} = .16 \mu m.$$

The resulting offsets are calculated as follows:

$$\delta x = \delta m'[\sqrt{2}/(1 + \sqrt{2})] = .0000037 \text{ inch} = .09 \mu m,$$

$$\delta y = \delta m[\sqrt{2}] = .0000088 \text{ inch} = .22 \mu m \text{ and}$$

$$\delta \Psi = \delta m/(1 + \sqrt{2})(3) = .00000086 \text{ radians}.$$

Similarly, the simplified flow chart of FIG. 24B outlines the procedure followed in leveling a region with one or two focus detectors off of the wafer. Following the procedure outlined the computer determines that one or two focus detectors will be off of the wafer and also determines which ones will be off of the wafer. Those focus detectors are deactivated and the stage is moved to the address of the region where $z_d$, $z_e$ and/or $z_f$ are/is measured with the still active focus detector(s). The computer then calculates $z_a = z_b = z_c$ and the support assemblies are driven vertically to a position where the LVDT outputs match the calculated values. If the chuck utilizes link constraints, $\delta x$, $\delta y$ and $\delta \Psi$ offsets are calculated to accommodate link foreshortening as before (if it doesn't, the offset steps are ignored in either case); the stage and platform are moved; and the wafer focusing verified.

Referring now to FIG. 21, there is shown optical assembly 22, containing a lens group 116 adapted for imaging stage mark 24, located on an object plane 118 of lens group 116, at image point 20, located on a corresponding image plane 120 of lens group 116. Optical assembly 22 is mounted on the main stage 26, as shown in FIG. 1, and is positioned vertically so that image plane 120 is coplaner with image plane 54 of the unit magnification catadioptric lens 18 as shown in FIG. 3A. Stage mark 24 is identical in shape to wafer alignment mark 78, and sized so that its image at image point 20 is the same size as wafer alignment mark 78.

When stage mark 24 is illuminated by light from either of the reticle alignment windows 76′ or 76″, it performs the same alignment functions described hereinbefore as any wafer alignment mark 78.

The simplified flow chart of FIG. 22 outlines the procedure followed in the utilization of the improved step-and-repeat alignment and exposure system. Following the procedure outlined we find reticle 12 loaded into position on unit magnification catadioptric lens 18, step-and-repeat alignment and exposure system 10 calibrated by sequentially aligning the image of stage mark 24 at image point 20 with each of the illuminated areas 84′ and 84″, separated by distance w, and the offset values $\delta x$, $\delta y$ and $\phi$ calculated by use of the formulas $$\delta x = \tfrac{1}{2}(\delta x' + \delta x''),$$

$$\delta y = \tfrac{1}{2}(\delta y' + \delta y'')$$

and $$\phi = \arcsin(\delta y' - \delta y'')/w;$$

where $\delta x'$ and $\delta x''$ are the X axis alignment errors of illuminated areas 84′, and 84″, respectively, as determined by the formulas $$\delta x' = k[(\Delta t_1' - \Delta t_2') + (\Delta t_3' - \Delta t_4')]$$

and $$\delta x'' = k[(\Delta t_1'' - \Delta t_2'') + (\Delta t_3'' - \Delta t_4'')];$$

and $\delta y'$ and $\delta y''$ are the Y axis alignment errors of illuminated areas 84′ and 84″, respectively, as determined by the formulas $$\delta y' = k[(\Delta t_1' - \Delta t_2') - (\Delta t_3' - \Delta t_4')]$$

and $$\delta y'' = k[(\Delta t_1'' - \Delta t_2'') - (\Delta t_3'' - \Delta t_4'')];$$

as explained hereinbefore, where k is a constant of proportionality, with dimensions of inches/second, required to convert, tv scan line derived, time data into stage travel distances.

Once the reticle is loaded and the step-and-repeat alignment system calibrated, wafer 14 is loaded onto chuck 90 and wafer processing begun. The locations on the wafer are specified in the U, V system of co-ordinates and the chuck rotated by $\Psi = \phi$ before further processing.

If the wafer is to be processed at the first level, the stage is programmed to move region by region thru a serpentine sequence of motions, as shown in FIG. 23, across the image 57 of reticle 12, pausing at each region for an exposure of the image in the photosensitive emulsion coated on wafer 14, along the offset and rotated U and V axes of motion. The required motion of the stage in the X,Y system of co-ordinates along the X and Y axes of motion is found by the following formulas:

$$x = u(\cos\phi) - v(\sin\phi) + \delta x$$

and $$y = u(\sin\phi) + v(\cos\phi) + \delta y.$$

If the wafer is to be globally aligned and shot "blind" the stage is programmed to move sequentially to a region on the left where each of the appropriate alignment marks 78′ and 78″ are aligned to a "best fit" without rotation with each of the illuminated areas 84′ and 84″, respectively, and a set of left region alignment offsets are determined by the formulas $$\delta u_a = \tfrac{1}{2}(\delta u' + \delta u'')$$

and $$\delta v_a = \tfrac{1}{2}(\delta v' + \delta v'');$$

followed by a move, of distance l, to a region on the right where each of similar appropriate alignment marks 78′ and 78″ are aligned to a "best fit" without rotation with each of the illuminated areas 84′ and 84″, respectively, and a set of right region alignment offsets are determined by the formulas $$\delta u_b = \tfrac{1}{2}(\delta u''' + \delta u'''')$$

and $$\delta v_b = \tfrac{1}{2}(\delta v''' + \delta v'''');$$

followed by a computation of a set of best average alignment offsets determined by the formulas $$\delta u = \tfrac{1}{2}(\delta u_a + \delta u_b),$$

$$\delta v = \tfrac{1}{2}(\delta v_a + \delta v_b)$$

and $$\delta \Psi = \arcsin(\delta v_b - \delta v_a)/l;$$

and, finally, a programmed move, region by region in a serpentine fashion, exposing each region as described hereinbefore for the first level, with the additional inclusion of the $\delta u$, $\delta v$ and $\delta \Psi$ offsets.

If each region is to be aligned and immediately exposed, the stage is programmed to move region by region in the serpentine fashion, aligning the first region by determining alignment offsets by the formulas $$\delta u = \tfrac{1}{2}(\delta u' + \delta u''),$$

$$\delta v = \tfrac{1}{2}(\delta v' + \delta v'')$$

and $$\delta \Psi = \arcsin(\delta v' - \delta v'')/w;$$

followed by the stage being moved the offset distances; the exposure made; the stage moved to position the next region coincident with image 57 (including calculated offsets $\delta u$, $\delta v$ and $\delta \Psi$); and the procedure repeated until the wafer is completely exposed.

GLOSSARY OF SYMBOLS a,b,c—Locations of the center lines of the support assemblies.

d,e,f—Locations of the focus detectors relative to a,b and c.

g,h,j—Linear co-ordinate measurements of the positions of points d, e and f as defined in the Description of the Preferred Embodiments.

k—A constant of proportionality as defined in the Description of the Preferred Embodiments.

l—The distance, across a wafer, from a first region utilized for global alignment to a second region utilized for global alignment.

L—A length measurement of either of the laser interferometers of the step-and-repeat alignment and exposure system.

LVDT—A linear measurement transducer (a linear variable differential transformer).

m—A distance along a link, beginning at an end, defined only to the middle of the link and measured in inches.

M—The particular level of microcircuitry being printed.

n—The index of refraction of an optical material (in this case a glass).

nm—Nanometer, a unit of measure equal to one billionth of a meter. For instance, the green line of mercury (the "F" line) has a wavelength of 546 nm or 0.0000215 inch.

N—The total number of levels of microcircuitry necessary to complete the semiconductive regions on the semiconductive wafer.

$O_{a,b,c}$—A point located on image plane 54 at the intersection of the $S_{a,b,c}$ and $T_{a,b,c}$ axes of motion.

p', p"—Horixontal axes of motion of either microscope objective.

q', q"—Axes of motion of either microscope objective orthogonal to p', p" respectively.

r—The radius of an optical surface.

R—A radius of the rotational $\Psi$ platform to a support assembly center line.

$R_w$—A radius of the semiconductive wafer.

s—An axial length between an optical surface and an object related to that surface (in this case an image related to another lens).

s'—An axial length between an optical surface and an image related to that surface (in this case a virtual image).

$s_{a,b,c}$—Addresses along the $S_{a,b,c}$ axes of motion.

$S_{a,b,c}$—Axes of motion defined by the center line of the coil structure of an LVDT.

t—The measure of time.

$t_{a,b,c}$—Addresses along the $T_{a,b,c}$ axes of motion.

$T_{a,b,c}$—Axes of motion defined by the center line of the coil structure of a second LVDT and intersecting the $S_{a,b,c}$ axes of motion at point $O_{a,b,c}$ in this case orthogonally).

tv—A symbol standing for television.

u—An address along the U axis of motion.

U—An axis of motion of the main stage of the step-and-repeat alignment and exposure system in the horizontal plane at an angle of $\phi$ from the X axis of motion.

v—An address along the V axis of motion.

V—An axis of motion of the main stage of the step-and-repeat alignment and exposure system in the horizontal plane orthogonal to the U axis of motion.

w—The distance from a first reticle alignment window to a second reticle alignment window.

x—An address along the X axis of motion.

X—An axis of motion of the main stage of the step-and-repeat alignment and exposure system directed left to right in the horizontal plane.

y—An address along the y axis of motion.

Y—An axis of motion of the main stage of the step-and-repeat alignment and exposure system directed front to back in the horizontal plane and orthogonal to the X axis.

z—Measurements in the Z direction.

Z—A vertical axis of the step-and-repeat alignment and exposure system orthogonal to the horizontal plane.

$\gamma$—Gamma, a symbol designating chuck tilt angle.

$\delta$—Delta, a symbol meaning a small offset $\Delta$—Delta, a symbol meaning a differential change of position along any axis of motion or the measurement of time.

$\theta$—Theta, an angle between the Y axis of motion and either of the laser interferometer mirrors of the step-and-repeat alignment and exposure system (nominally 45°).

$\mu$m—Micron, a measure of length equal to one millionth of a meter.

$\phi$—Phi, an angle of the horizontal plane between the X and U axes of motion.

$\Psi$—Psi, the angle of rotation about the Z axis.

The terms and expressions which have been employed here are used as terms of description and not of limitations, and there is no intention, in the use of such terms and expressions of excluding equivalents of the features shown and described, or portions thereof, it being recognized that various modifications are possible within the scope of the invention claimed.

I claim:

1. Photometric printing apparatus for printing an image from a first object, which first object has non opaque portions, onto a second object comprising:
    a holder for holding the first object;
    a stage for holding the second object;
    a light source unit, optically disposed on one side of the holder and providing actinic and viewing wavelengths, for uniformly illuminating the first object;
    a unit magnification catadioptric lens, optically disposed on the other side of the holder and between the holder and the stage, for projecting an image of the non opaque portions of the illuminated first object onto the second object along a forward path and for projecting conjugate images of the second object into a conjugate plane along a conjugate path including transmission in a reverse direction along a portion of the forward path;
    first optical means, optically supplementing the portion of the unit magnification catadioptric lens nearest the holder, for providing a viewing port to permit viewing of a portion of a conjugate image of the second object, wherein the conjugate image is projected along the conjugate path and results when the second object is illuminated by the projected image of the non opaque portions of the first object; and
    second optical means optically disposed for viewing the portion of the projected conjugate image from the viewing port.

2. Photometric printing apparatus as in claim 1 wherein the second object has a coating of photosensitive emulsion thereon and further wherein the light source unit includes:
    actinic shutter means disposed for selectively controlling the passage of actinic wavelengths to the first object so that the portion of the projected conjugate image can be viewed without random exposure of the photosensitive emulsion coating.

3. Photometric printing apparatus as in claim 1 or 2 wherein the first optical means includes:
prism means for coupling light into and out of the unit magnification catadioptric lens;
a beam splitting coating on a diagonal surface of a portion of the prism means nearest the holder; and
an additional prism coupled to the beam splitting coating to provide a portion of the conjugate path associated with the viewing port.

4. Photometric printing apparatus as in claim 3 wherein the beam splitting coating comprises a multilayer "cold mirror" dielectric filter forming a highly reflective surface for the actinic wavelengths and simultaneously a beam splitter for the viewing wavelengths.

5. Photometric printing apparatus as in claim 3 wherein the second optical means comprises a viewing microscope which provides a viewing microscope image to an optical utilization device.

6. Photometric printing apparatus as in claim 5 wherein the optical utilization device comprises means for converting the viewing microscope image into corresponding electrical signals.

7. Photometric printing apparatus as in claim 5 wherein a field of view of the projected conjugate image is presented by the viewing port and further wherein the viewing microscope includes:
an infinity corrected objective; and
a focusing lens;
wherein the infinity corrected objective is positioned to couple the light from the viewed portion of the projected conjugate image onto the focusing lens in an infinity corrected manner and the focusing lens is positioned to focus the coupled light coming from the infinity corrected objective at the optical utilization device; and
further wherein the focusing lens has an aperture larger than the lateral dimension of the field of view of the projected conjugate image of the second object, so that the infinity corrected objective can be utilized to view any portion of the field of view of the projected conjugate image by lateral motion over the field of view of the projected conjugate image of the second object without any concomitant motion of the focusing lens or the optical utilization device.

8. Photometric printing apparatus as in claim 7 wherein the infinity corrected objective includes a 90° beam bender providing a folded optical path and the infinity corrected objective is allowed to move both axially and transversely, with respect to the folded optical path, over the field of view of the projected conjugate image of the second object.

9. Photometric printing apparatus as in claim 8, wherein the optical path from a face of the prism means, adjacent the first or second object, to the beam splitting coating of the prism means has a predetermined length, and the prism means are separated from the first object and from the second object by a predetermined working distance; wherein the additional prism has a length shorter than the predetermined length; and further wherein the infinity corrected objective includes:
an additional prism-lens located apart from the additional prism by a distance substantially equal to the working distance of the unit magnification catadioptric lens so that the projected conjugate image is formed at a point within the additional prism-lens;
wherein the prism-lens includes
a 45° diagonal surface which functions as the 90° beam bender by total internal reflection;
a remote end which is located a distance −s beyond the point of formation of the projected conjugate image, said remote end comprising a convex surface of radius r, where −s and r are chosen by the formula $$-s = r(n+1)/n,$$

so that a virtual image of the portion of the projected conjugate image is formed at a distance $$s' = r(n+1)$$

in front of said remote end; and
a positive lens having back focal length greater than s' positioned beyond the prism-lens with its focal point coincident with the virtual image.

10. Photometric printing apparatus as in claim 5 or 9 wherein an additional viewing microscope is provided and the two viewing microscopes are utilized in a split-field manner.

11. Photometric printing apparatus for printing an image from a first object, which first object has non opaque portions, onto a second object comprising:
a holder for holding the first object;
a stage for holding the second object;
a light source unit, optically disposed on one side of the holder, for uniformly illuminating the first object;
an imaging lens, optically disposed on the other side of the holder and between the holder and the stage, for projecting an image of non opaque portions of the illuminated first object onto the second object, wherein said image of the non opaque portions is projected into an image plane of the imaging lens, and wherein the imaging lens also projects a conjugate image of the second object into an object plane of the imaging lens;
first optical means, supplementing the reverse imaging capability of the imaging lens, for providing a viewing port, conjugate to the object plane of the imaging lens, to permit viewing of a portion of a conjugate image of the second object wherein the conjugate image results when the second object is illuminated by the projected image of the non opaque portions of the first object;
second optical means optically disposed for viewing the portion of the projected conjugate image present at the viewing port: and
third optical means disposed on the stage for providing an alignment reference for the image of the first object in the plane of the image of the first object when said third optical means are illuminated by the image of the first object, wherein said alignment reference is a stage reference mark image of a stage reference mark positioned on the stage.

12. Photometric printing apparatus as in claim 11 wherein the third optical means comprises a positive lens grouping for imaging the stage reference mark into the plane of the image of the first object when illuminated by the image of the first object.

13. Photometric printing apparatus as in claim 12 wherein the first object comprises a reticle having two reticle alignment windows so that the image of the non opaque portions of the first object includes images of the two reticle alignment windows, further including:

control means coupled to the stage for moving the stage along X and Y axes of motion to position the third optical means relative to the image of the first object; and alignment means responsive to the second optical means and coupled to the control means for actuating the control means until the stage reference mark image is substantially aligned within the image of either of the two reticle alignment windows.

14. Photometric printing apparatus as in claim 1 wherein the first object is a reticle having a least two reticle alignment windows, and the second object is a semiconductive wafer having at least two wafer alignment marks, further including;

third optical means disposed on the stage for providing an alignment reference for the image of the first object in the plane of the image of the first object when said third optical means are illuminated by the image of the first object;

rotational means coupled to the stage for supporting the semiconductive wafer;

control means coupled to the stage and the rotational means, for moving the semiconductive wafer along X and Y axes of motion and for rotating the semiconductive wafer about an orthogonal Z axis to position the semiconductive wafer relative to the image of the first object; and alignment means responsive to the second optical means and coupled to the control means for moving the stage and the rotational means to position the semiconductive wafer such that the wafer alignment marks are aligned within both images of the reticle alignment windows.

15. Photometric printing apparatus comprising:
a holder for holding a first object;
a light source unit, optically disposed on one side of the holder, for uniformly illuminating the first object;
a stage positionable along X and Y axes of motion;
an imaging lens, optically disposed on the other side of the holder and between the holder and the stage, for projecting an image of non-opaque portions of the illuminated first object onto a second object;
a rotational platform, supported by and coupled to the stage for X,Y motion and positioning therewith, for positioning the second object about a Z axis of rotation;
control means for positioning the stage along the X and Y axes of motion and the rotational platform about the Z axis;
a chuck, supported by and coupled to the rotational platform for X,Y motion therewith by kinematic support means, for holding the second object;
where the kinematic support means comprise:
means for constraining horizontal linear and yaw motion of the chuck relative to the rotational platform along three axes, said axes being located in a single plane parallel to but not coincident with an image plane of the imaging lens;
at least three vertically oriented support assemblies for providing controlled motions of the chuck in vertical position, pitch and roll including position sensor means for indicating the vertical position of each vertically oriented support assembly;
at least three focus sensors, positioned around the projected image of the first object, for sensing the vertical position and planerization of the second object relative to the image plane of the imaging lens; and means for controlling the vertically oriented support assemblies to regulate the vertical position, pitch and roll of the second object in response to signals from the focus sensors.

16. Photometric printing apparatus as in claim 15 wherein the constraining means comprise linear spring members affixed to the chuck and to the rotational platform, said linear spring members having a shape and orientation so as to constrain the motion of the chuck in the single plane.

17. Photometric printing apparatus as in claim 16, wherein the chuck can be tilted with respect to the rotational platform and the constraining linear spring members can be foreshortened as the vertical position, pitch and roll are regulated, including computation means responsive to the chuck tilt and constraining member foreshortening for providing $\delta x$, $\delta y$ and $\delta \Psi$ offsets to the stage and rotational platform control means for final positioning of the stage and rotational platform to compensate for errors introduced by chuck tilt and constraining member foreshortening.

18. Photometric printing apparatus as in claim 15 wherein the position sensor are LVDT's.

19. Photometric printing apparatus as in claim 18 wherein the vertically oriented support assemblies include linear motors for providing vertical thrust.

20. Photometric printing apparatus as in claim 19 wherein the linear motors are moving coil linear motors and further wherein two linear motors are included in each vertically oriented support assembly.

21. Photometric printing apparatus as in claim 19 wherein the linear motors are moving magnet linear motors and further wherein two linear motors are included in each vertically oriented support assembly.

22. Photometric printing appararus as in claim 15 wherein the control means includes computation means for providing vertical position addresses for each vertically oriented support assembly in response to the signals from the set of at least three focus sensors.

23. Photometric printing apparatus as in claim 22. including means for determining whether a focus sensor is positioned over the second object, wherein the vertical position address computation means average the signals from the focus sensors that are determined to be positioned over the second object whenever less than three focus sensors are positioned over the second object; and further wherein the vertical position address computation means provide equal vertical position address offsets to the vertically oriented support assemblies to maintain the previous planerization and achieve the best focus of the second object possible with such limited information.

24. Photometric printing apparatus as in claim 22 or 23 wherein the vertical position computation means provide reference offsets; and further including a plurality of servo control means responsive to the reference offsets, comprising
a servo amplifier, vertical drive means and the position sensor means; and wherein
each servo control means controls the vertical positioning of a portion of a plane of the second object coincident with the axis of the LVDT.

25. Photometric printing apparatus comprising:
a holder for holding a first object;

a light source unit, optically disposed on one side of the holder, for uniformly illuminating the first object;

a stage positionable along X and Y axes of motion;

an imaging lens, optically disposed on the other side of the holder and between the holder and the stage, for projecting an image of non opaque portions of the illuminated first object onto a second object;

a rotational platform supported by and coupled to the stage for X,Y motion and positioning therewith, for positioning the second object about a Z axis;

control means for positioning the stage along the X and Y axes of motion and the rotational platform about the Z axis;

a chuck, for holding the second object;

electromagnetic support means for supporting and coupling the chuck to the rotational platform for X,Y motion with the platform comprising at least three two-degree of freedom support assemblies and two degree of freedom position sensor means for providing controlled motions in vertical position, pitch and roll while constraining horizontal linear and yaw motions with respect to the rotational platform in a plane coincident with an image plane of the imaging lens;

a set of at least three focus sensors, positioned with respect to the imaging lens, for providing vertical position information about the second object relative to the image plane of the imaging lens; and control means coupled to the focus sensors for actuating the three support assemblies to regulate the vertical position, pitch and roll of the second object and to maintain the horizontal position and yaw of the second object with respect to the rotational platform.

26. Photometric printing apparatus as in claim 25 wherein the two degree of freedom position sensor means comprise two LVDT's.

27. Photometric printing apparatus as in claim 26 wherein the LVDT's include coil structures and further wherein the LVDT's are positioned at oblique angles to the image plane so that the center lines of the coil structures of the LVDT's intersect at a point on the image plane of the imaging lens.

28. Photometric printing apparatus as in claim 27 wherein the oblique angles are 45°.

29. Photometric printing apparatus as in claim 28 wherein the two degree of freedom support assemblies include linear motors for providing thrust.

30. Photometric printing apparatus as in claim 29 wherein the linear motors are positioned to provide thrust in a direction parallel to the center of the coil structures of the LVDT's.

31. Photometric printing apparatus as in claim 30 wherein the center lines of the linear motors and the LVDT's are coplaner.

32. Photometric printing apparatus as in claim 29, 30 or 31 wherein the linear motors are moving coil linear motors.

33. Photometric printing apparatus as in claim 29, 30 or 31 wherein the linear motors are moving magnet linear motors.

34. Photometric printing apparatus as in claim 25 wherein the control means includes computation means responsive to the signals from the set of three focus sensors for providing vertical position addresses for each support assembly.

35. Photometric printing apparatus as in claim 34 wherein the vertical position address computation means average the signals from any of the focus sensors still positioned over the second object when less that all of the focus sensors are positioned over the second object and provide equal vertical position address offsets for the three support assemblies to maintain the previous planerization and achieve the best possible focus of the second object in light of the limited information from the sensors.

36. Photometric printing apparatus as in claim 34 or 35 wherein the vertical position address computation means provide three sets of reference offsets, further including a plurality of servo amplifier means each responsive to a different one of the sets of reference offsets and to the position signals from a different one of the two-degree of freedom position sensor means for driving each of the two-degree of freedom support assemblies to a position corresponding to the associated reference offset; wherein each of the plurality of servo amplifier means which are associated with a particular two-degree of freedom support assemblies operate to control the vertical position and constrain the tangential motion of one portion of the plane of the second object adjacent to the intersection of the center lines of the coil structures of the two LVDT's of the particular two-degree of freedom support assembly.

37. Photometric printing apparatus comprising:

a holder for holding a first object;

a light source unit, optically disposed on one side of the holder, for uniformly illuminating the first object;

a stage;

an imaging lens, optically disposed on the other side of the holder and between the holder and the stage, for projecting an image of non opaque portions of the illuminated first object onto a second object;

stage control means for positioning the stage along the X and Y axes of motion;

a chuck for holding the second object;

electromagnetic support means for supporting and coupling the chuck to the stage for X,Y motion an positioning therewith; the electromagnetic support means comprising three two degree of freedom support assemblies for providing controlled motions in vertical position, pitch and roll while constraining horizontal linear motion and providing controlled yaw motion with respect to the stage in a plane coincident with an image plane of the imaging lens and three two degree of freedom position sensor means for providing position information about the two-degree of freedom support assemblies;

a set of three focus sensors, positioned on the imaging lens, for providing vertical position information about the second object relative to the image plane of the imaging lens; and control means coupled to the focus sensors for providing the three support assemblies to regulate the vertical position, pitch and roll of the second object in response to vertical position information from the set of three focus sensors, for maintaining the horizontal position of the second object with respect to the stage and for regulating the yaw position of the seond object with respect to the stage.

38. Photometric printing apparatus as in claim 37 wherein the two degree of freedom position sensor means comprise two large bore LVDT's.

39. Photometric printing apparatus as in claim 38 wherein the large bore LVDT's include coil structures and further wherein the large bore LVDT's are positioned at oblique angles to the image plane of the imaging lens so that the center lines of the coil structures intersect at a point on the image plane of the imaging lens.

40. Photometric printing apparatus as in claim 39 wherein the oblique angles are 45°.

41. Photometric printing apparatus as in claim 40 wherein the two degree of freedom support assemblies include linear motors for providing thrust.

42. Photometric printing apparatus as in claim 41 wherein the linear motors are positioned to provide thrust parallel to center lines of coil structures of the large bore LVDT's.

43. Photometric printing apparatus as in claim 42 wherein the center lines of the linear motors and the large bore LVDT's are coplaner.

44. Photometric printing apparatus as in claim 43 wherein the linear motors are constructed to function like moving coil linear motors but which have generally rectangular cross sections, which cross sections are opened up for appreciable operating clearances in the tangential direction.

45. Photometric printing apparatus as in claim 37 wherein the control means include computation means responsive to the position information from the set of three focus sensors for providing vertical position and rotational addresses for each support assembly.

46. Photometric printing apparatus as in claim 45 wherein the vertical and rotational position computation means average signals from any of the focus sensors still positioned over the second object whenever less than all of the three focus sensors are positioned over the second object and provide equal vertical position address offsets for the three support assemblies to maintain the previous planerization and achieve the best focus of the second object possible with such limited information.

47. Photometric printing apparatus as in claim 45 or 46 wherein the vertical position and rotational address computation means provide three sets of reference offsets, further including
a plurality of servo amplifier means each responsive to a different one of the sets of reference offsets and to the position signals from a different one of the two-degree of freedom position sensor means for driving each of the two-degree of freedom support assemblies to a position corresponding to the associated reference offset; wherein each of the plurality of servo amplifier means which are associated with a particular two-degree of freedom support assemblies operate to control the vertical position and constrain the tangential motion of one portion of the plane of the second object adjacent to the intersection of the center lines of the coil structures of the two LVDT's of support assembly.

* * * * *